United States Patent
Sarpatwari et al.

(10) Patent No.: US 12,080,359 B2
(45) Date of Patent: *Sep. 3, 2024

(54) IDENTIFY THE PROGRAMMING MODE OF MEMORY CELLS DURING READING OF THE MEMORY CELLS

(71) Applicant: Micron Technology, Inc., Boise, ID (US)

(72) Inventors: Karthik Sarpatwari, Boise, ID (US); Fabio Pellizzer, Boise, ID (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/189,824

(22) Filed: Mar. 24, 2023

(65) Prior Publication Data

US 2023/0230642 A1    Jul. 20, 2023

Related U.S. Application Data

(63) Continuation of application No. 17/221,420, filed on Apr. 2, 2021, now Pat. No. 11,615,854.

(51) Int. Cl.
*G11C 7/00* (2006.01)
*G11C 16/10* (2006.01)
(Continued)

(52) U.S. Cl.
CPC .......... *G11C 16/3404* (2013.01); *G11C 16/10* (2013.01); *G11C 16/26* (2013.01); *G11C 16/30* (2013.01)

(58) Field of Classification Search
CPC ....... G11C 7/1051; G11C 7/22; G11C 7/1072; G11C 7/1006; G11C 7/1066
(Continued)

(56) References Cited

U.S. PATENT DOCUMENTS 7,864,567 B2    1/2011   Gordon et al.
8,239,735 B2    8/2012   Shalvi et al.
(Continued)

FOREIGN PATENT DOCUMENTS

WO    2021176244    9/2021

OTHER PUBLICATIONS

D.J.C. Mackay, S.T. Wilson, and M.C. Davey. Comparison of constructions of irregular gallager codes. IEEE Transactions on Communications, 47(10):1449-1454, 1999.
(Continued)

*Primary Examiner* — Son T Dinh
(74) *Attorney, Agent, or Firm* — Greenberg Traurig

(57) ABSTRACT

Systems, methods and apparatus to determine a programming mode of a set of memory cells that store an indicator of the programming mode. In response to a command to read the memory cells in a memory device, a first read voltage is applied to the memory cells to identify a first subset of the memory cells that become conductive under the first read voltage. The determination of the first subset is configured as an operation common to different programming modes. Based on whether the first subset of the memory cell includes one or more predefined memory cells, the memory device determines a programming mode of memory cells. Once the programming mode is identified from the common operation, the memory device can further execute the command to determine a data item stored, via the programming mode, in the memory cells.

19 Claims, 11 Drawing Sheets

(51) Int. Cl.
  *G11C 16/26*  (2006.01)
  *G11C 16/30*  (2006.01)
  *G11C 16/34*  (2006.01)

(58) Field of Classification Search
  USPC .................................. 365/189.15, 189.14
  See application file for complete search history.

(56) References Cited

U.S. PATENT DOCUMENTS

| | | | |
|---|---|---|---|
| 9,099,174 | B2 | 8/2015 | Calderoni et al. |
| 9,275,730 | B2 | 3/2016 | Tortorelli et al. |
| 9,613,691 | B2 | 4/2017 | Mantegazza et al. |
| 10,431,301 | B2 | 10/2019 | Mirichigni et al. |
| 10,566,052 | B2 | 2/2020 | Mirichigni et al. |
| 10,636,480 | B2 * | 4/2020 | Intrater .............. G11C 13/0069 |
| 10,950,315 | B1 | 3/2021 | Jeon et al. |
| 11,087,849 | B2 | 8/2021 | Chin et al. |
| 11,139,034 | B1 | 10/2021 | Sarpatwari et al. |
| 11,194,473 | B1 | 12/2021 | Zhao et al. |
| 11,238,945 | B1 | 2/2022 | Di Vincenzo |
| 11,295,822 | B2 | 4/2022 | Sarpatwari et al. |
| 11,367,484 | B1 | 6/2022 | Lee et al. |
| 11,514,983 | B2 | 11/2022 | Sarpatwari et al. |
| 11,615,854 | B2 * | 3/2023 | Sarpatwari .......... G11C 11/5642 365/185.24 |
| 2010/0122016 | A1 | 5/2010 | Marotta et al. |
| 2013/0016562 | A1 | 1/2013 | Mun |
| 2013/0016565 | A1 | 1/2013 | Park et al. |
| 2013/0070524 | A1 | 3/2013 | Dutta et al. |
| 2013/0132652 | A1 | 5/2013 | Wood et al. |
| 2014/0160842 | A1 | 6/2014 | Takafuji et al. |
| 2014/0229131 | A1 | 8/2014 | Cohen et al. |
| 2015/0117129 | A1 | 4/2015 | Jung |
| 2016/0125952 | A1 | 5/2016 | Hu et al. |
| 2017/0177235 | A1 * | 6/2017 | Nishikubo .......... G11C 11/5628 |
| 2018/0040370 | A1 | 2/2018 | Tortorelli et al. |
| 2018/0067697 | A1 | 3/2018 | Lee et al. |
| 2018/0286488 | A1 | 10/2018 | Sanasi et al. |
| 2018/0286495 | A1 | 10/2018 | Oh et al. |
| 2018/0357535 | A1 | 12/2018 | Shulkin et al. |
| 2019/0115078 | A1 | 4/2019 | Kim et al. |
| 2019/0172542 | A1 | 6/2019 | Miladinovic |
| 2019/0198099 | A1 | 6/2019 | Mirichigni et al. |
| 2019/0295660 | A1 | 9/2019 | Malshe et al. |
| 2019/0311768 | A1 | 10/2019 | Wang et al. |
| 2019/0348127 | A1 | 11/2019 | Chin et al. |
| 2019/0348143 | A1 | 11/2019 | Zeng et al. |
| 2019/0391914 | A1 | 12/2019 | Hsiao et al. |
| 2020/0152274 | A1 | 5/2020 | Park et al. |
| 2020/0234775 | A1 | 7/2020 | Singidi et al. |
| 2020/0364103 | A1 | 11/2020 | Sharifi Tehrani |
| 2021/0011769 | A1 | 1/2021 | Xie et al. |
| 2021/0012856 | A1 | 1/2021 | Xie et al. |
| 2021/0034291 | A1 | 2/2021 | Shen et al. |
| 2021/0065828 | A1 * | 3/2021 | Yu ...................... G11C 11/5628 |
| 2021/0201995 | A1 | 7/2021 | Castro et al. |
| 2021/0202018 | A1 | 7/2021 | Hirst et al. |
| 2021/0312976 | A1 | 10/2021 | Pellizzer et al. |
| 2022/0013167 | A1 | 1/2022 | Robustelli et al. |
| 2022/0013183 | A1 | 1/2022 | Sarpatwari et al. |
| 2022/0068391 | A1 | 3/2022 | Tortorelli et al. |
| 2022/0284957 | A1 | 9/2022 | Lee et al. |
| 2022/0319587 | A1 | 10/2022 | Sarpatwari et al. |
| 2022/0319606 | A1 | 10/2022 | Sarpatwari et al. |
| 2022/0319615 | A1 | 10/2022 | Sarpatwari et al. |
| 2023/0058300 | A1 | 2/2023 | Sarpatwari et al. |

OTHER PUBLICATIONS

Hangxuan Cui, Jun Lin, and Zhongfeng Wang, "Information storage bit-flipping decoder for LDPC codes", IEEE Transactions on Very Large Scale Integration (VLSI) Systems, 28(11):2464-2468, 2020.
International Search Report and Written Opinion, PCT/IB2020/020022, mailed on Jan. 29, 2021.
International Search Report and Written Opinion, PCT/US2022/020391, mailed on Jun. 16, 2022.
International Search Report and Written Opinion, PCT/US2022/020523, mailed on Jun. 16, 2022.
International Search Report and Written Opinion, PCT/US2022/021408, mailed on Jul. 6, 2022.
R. Gallager, "Low-density parity-check codes," IRE Transactions on Information Theory, 8(1):21-28, 1962.
Tadashi Wadayama, Keisuke Nakamura, Masayuki Yagita, Yuuki Funahashi, Shogo Usami, and Ichi Takumi, "Gradient descent bit flipping algorithms for decoding LDPC codes", IEEE Transactions on Communications, 58(6):1610-1614, 2010.
Z. Li, L. Chen, L. Zeng, S. Lin, and W. Fong. Efficient encoding of quasi-cyclic low-density parity-check codes. IEEE Transactions on Communications, 53(11):1973-1973, 2005.

* cited by examiner

IDENTIFY THE PROGRAMMING MODE OF MEMORY CELLS DURING READING OF THE MEMORY CELLS

RELATED APPLICATIONS

The present application is a continuation application of U.S. patent application Ser. No. 17/221,420, filed Apr. 2, 2021, issued as U.S. Pat. No. 11,615,854 on Mar. 28, 2023, the entire disclosure of which application is hereby incorporated herein by reference.

TECHNICAL FIELD

At least some embodiments disclosed herein relate to memory systems in general and, more particularly but not limited to, techniques of programming memory cells to store data and retrieval the data from the memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

A memory device can include a memory integrated circuit having one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

A non-volatile integrated circuit memory cell can be programmed to store data by applying a voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
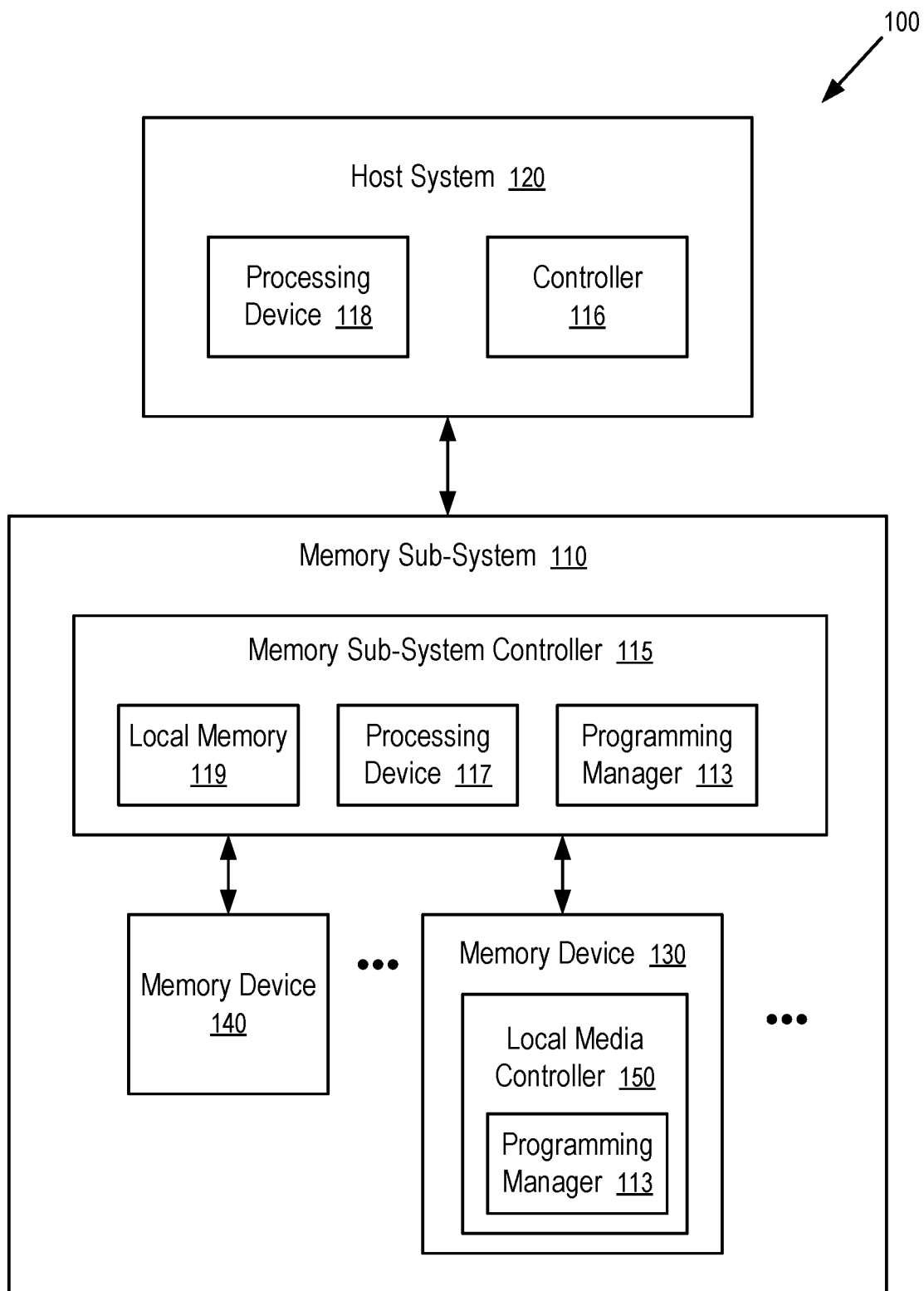
FIG. 1 illustrates an example computing system having a memory sub-system in accordance with some embodiments of the present disclosure.

At least some aspects of the present disclosure are directed to a memory sub-system configured to adaptively select a mode to program a set of memory cells to optimize performance in accessing the data stored in memory cells. The memory sub-system can be used as a storage device and/or a memory module. Examples of storage devices, memory modules, and memory devices are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell, such as a memory cell in a flash memory or a memory cell in a cross-point memory, can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one); and otherwise, the memory cell is storing a second bit value (e.g., zero).

Optionally, a memory cell can be configured or programmed to store more than one bit of data by being configured or programmed to have a threshold voltage in one of more than two separate voltage regions.

The threshold voltage of a memory cell is such that when the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in a Quad-Level Cell (QLC) mode, or a five-bit data item in a Penta-Level Cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data retrieved directly from the memory cells in the memory sub-system and/or recover the original data that is used to generate the data for storing in the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command, which can cause substantial delay in retrieving the data from the memory cells and degrade the overall read performance of the memory sub-system.

Storing more redundant information can improve the error recovery capability of the memory sub-system and thus reduce read retry. However, storing more redundant information can increase the requirement for data storage capacity.

Storing more than one bit per memory cell can increase data storage capacity but lead to a longer read operation than storing one bit per memory cell, and/or increase the bit error rate in reading the memory cells.

At least some aspects of the present disclosure address the above and other deficiencies by adaptively selecting data programming mode and error recovery options to optimize performance.

Different error recovery options can lead to encoded data of different sizes for a same given amount of data to be stored in a given set of memory cells. To accommodate the different sizes, the set of memory cells can be programmed in different modes to provide adequate storage capacity for the respective sizes of the encoded data generated using the different error recovery options.

When compared to a mode of less storage capacity, a mode of increased storage capacity can increase the operation delay in reading the memory cells but reduce read retry through increased redundant information stored using the increased storage capacity, when benefit of an increase in the redundant information out weights the drawback of an increase in the bit error rate for storing more bits per memory cell. When the reduction in read retry is greater than the increase in the operation delay in reading the memory cells, the mode of increased storage capacity and redundant information can be selected and used to improve the overall performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a programming manager 113 configured to adaptively select a programming mode of a set of memory cells based on usage parameters of the memory cells and/or a memory region containing the memory cells. In some embodiments, the controller 115 in the memory sub-system 110 includes at least a portion of the programming manager 113. In other embodiments, or in combination, the controller 116 and/or the processing device 118 in the host system 120 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 120, can be configured to execute instructions stored in memory for performing the operations of the programming manager 113 described herein. In some embodiments, the programming manager 113 is implemented in an integrated circuit chip (e.g., memory device 130) installed in the memory sub-system 110. In other embodiments, the programming manager 113 can be part of firmware of the memory sub-system 110, an operating system of the host system 120, a device driver, or an application, or any combination therein.

The programming manager 113 is configured to select a programming mode of a set of memory cells identified to store a given data item. The set of memory cells is identified for storing the given data item independent of the programming mode to be selected. When parameters characterizing the historic usage related to the set of memory cells indicates that a level of error recovery technique can optimize the performance in reading data the data item from the set of memory cells, the application of the level of error recovery technique determines a size of encoded data for the storing of the given data item; and the programming mode is selected to meet the storage capacity requirement of the size of encoded data. For example, the indication can be determined or obtained using a predictive model (e.g., a trained artificial neural network). The predictive model is configured to predict the indication according to the parameters about the historic usage, such as a read to write ratio of data stored into a memory region containing the data item, a count of write cycles in the memory region, a bit error rate in reading a portion of the memory region, etc.

Optionally, the memory device 130 includes a cross-point memory. In some implementations, the cross point memory uses a memory cell that has an element (e.g., a sole element) acting both as a selector device and a memory device. For example, the memory cell can use a single piece of alloy with variable threshold capability. The read/write operations of such a memory cell can be based on thresholding the memory cell while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

Such a self-selecting memory cell, having a selector/memory device, can be programmed in cross point memory to have a threshold voltage window. The threshold voltage window can be created by applying programming pulses with opposite polarity to the selector/memory device. For example, the memory cell can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

Figure 2:
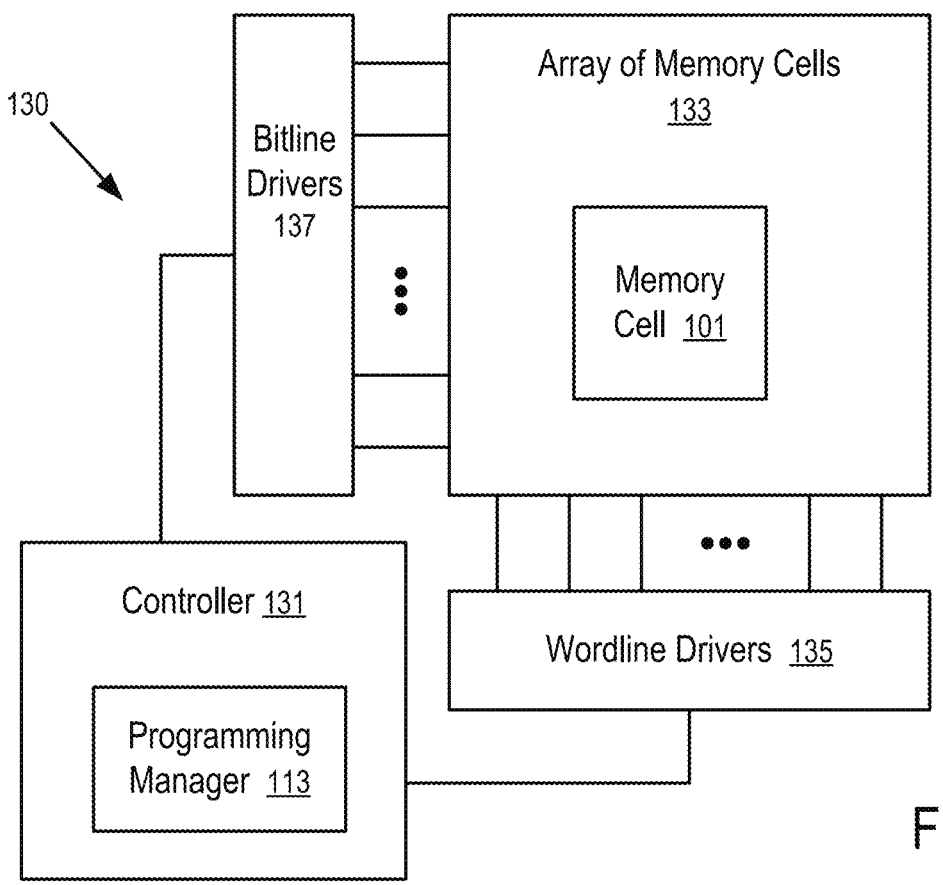
FIG. 2 shows a memory device configured with a programming manager according to one embodiment.

FIG. 2 shows a memory device configured with a programming manager according to one embodiment. For example, the memory device 130 illustrated in FIG. 1 can be implemented using a memory device of FIG. 2 with a cross-point memory; and the local media controller 150 in FIG. 1 can be implemented using the controller 131 in FIG. 2.

In FIG. 2, the memory device 130 includes an array 133 of memory cells, such as a memory cell 101.

The memory device 130 of FIG. 2 includes a controller 131 that operates bitline drivers 137 and wordline drivers 135 to access the individual memory cells (e.g., 101) in the array 133.

Figure 3:
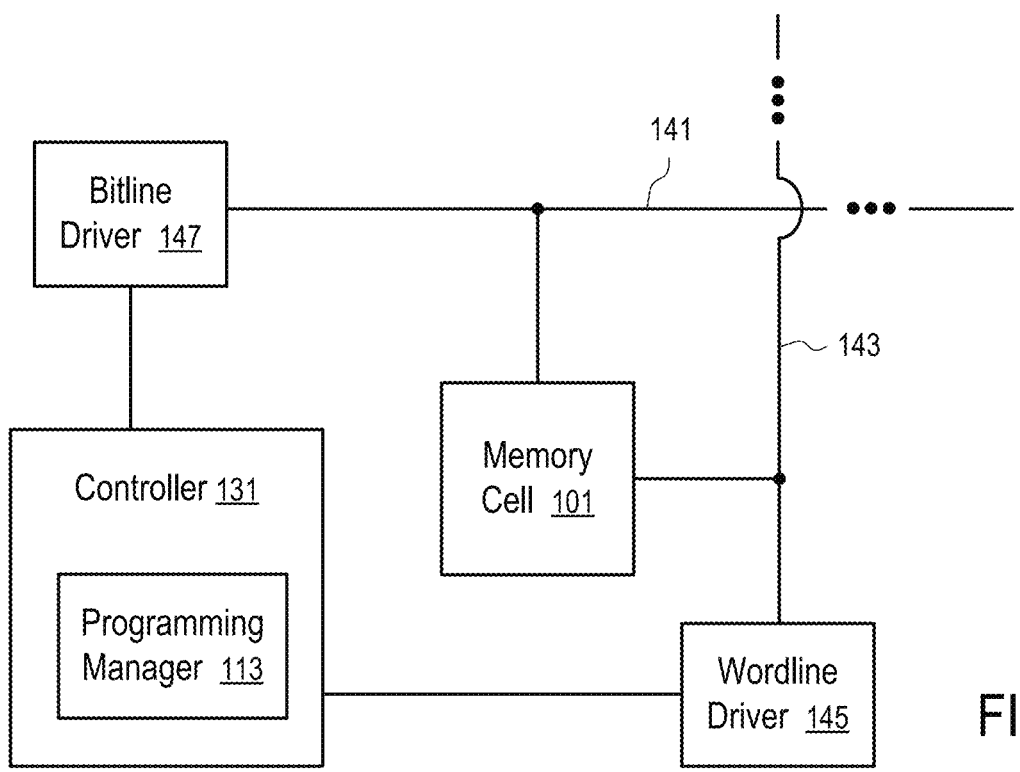
FIG. 3 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 3.

The controller 131 includes a programming manager 113. For example, the programming manager 113 can be implemented via logic circuits and/or microcodes/instructions to select, based on parameters about past usages of the array of memory cells, a mode of programming a set of memory cells to store a data item. For example, the usage parameters can include the ratio of read and write operations performed in the array of memory cells, a count of read operations in the array, a count of write operations in the array, a time to the last/previous write operation in the array, etc.

Since memory cells in different locations in the array 133 can have different bit error rates under the same usage, the programming manager 113 can select the programming for the set of memory cells based on attributes of the memory cells in the set, such as a location or address of the memory cell 101 in the memory device, the electrical distance of the memory cell 101 to its voltage drivers, a write timing parameter or its range of the memory cell 101, etc.

FIG. 3 shows a memory cell 101 with a bitline driver 147 and a wordline driver 145 configured to apply voltage pulses according to one embodiment. For example, the memory cell 101 can be a typical memory cell 101 in the memory cell array 133 of FIG. 2.

The bitline driver 147 and the wordline driver 145 of FIG. 3 are controlled by the programming manager 113 of the controller 131 to selectively apply one or more voltages pulses to program the threshold voltage of the memory cell 101 to store data, or to determine the voltage region of the threshold voltage of the memory cell 101 to retrieve the data.

For example, based on a mode selected to program the memory cell 101, the bitline driver 147 and the wordline driver 145 can be instructed or controlled by the programming manager 113 to program the memory cell 101 a single level cell (SLC) mode to store one bit per cell, or program the memory cell 101 in a multi-level cell (MLC) mode to store more than one bit per cell. In some implementations, a typical memory cell 101 can be programmed in a mode to store an average of 1.5 bits per cell; and in other implementations, a typical memory cell 101 can be programmed in a mode to store two or more bits per cell.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

To program the voltage threshold of the memory cell 101, the bitline driver 147 and the wordline driver 145 can drive a pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to change the threshold voltage of the memory cell 101 towards a voltage region that represents the data or bit value(s) to be stored in the memory cell 101.

The controller 131 can be configured in an integrated circuit having a plurality of decks of memory cells. Each deck can be sandwiched between a layer of bitlines, a layer of wordlines; and the memory cells in the deck can be arranged in an array 133. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 101 is connected to a bitline driver 147 and a wordline driver 145.

Optionally, the memory cell 101 is implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

Figure 4:
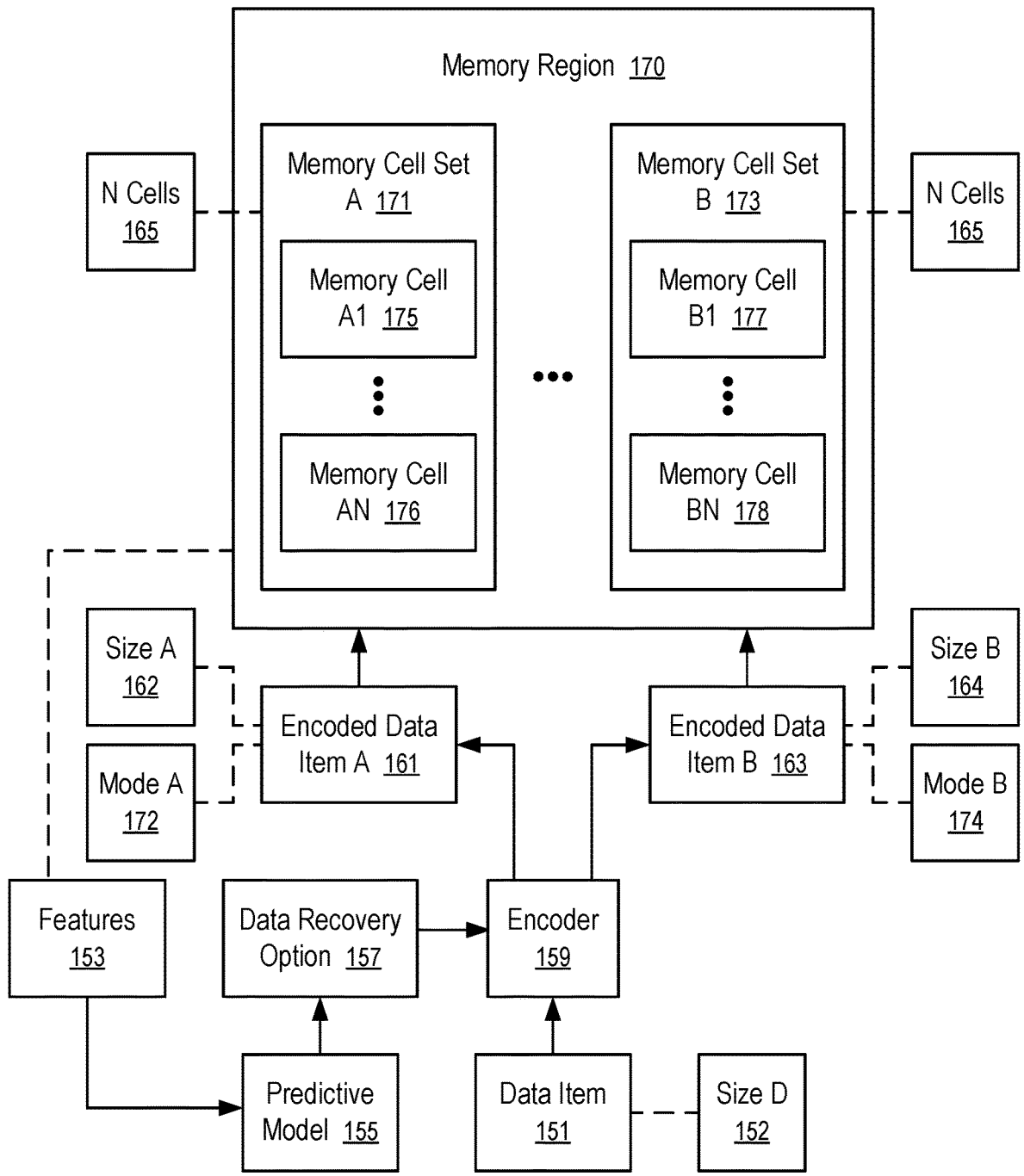
FIG. 4 shows a technique to adaptively provide storage capacity using a predetermined number of memory cells according to one embodiment.

FIG. 4 shows a technique to adaptively provide storage capacity using a predetermined number of memory cells according to one embodiment. For example, the technique of FIG. 4 can be implemented in a computing system 100 of FIG. 1 and/or a memory device 130 of FIG. 2.

In FIG. 4, a memory region 170 in a memory device provides multiple sets of memory cells to store data items (e.g., 151). The data items (e.g., 151) have a predetermined same size 152 before encoding of a data recovery option 157 is applied to store each data item (e.g., 151). For example, the memory region 170 can be a portion of the array 133 in a memory device 130 in FIG. 2, or be a portion of a memory device 130 in the computing system 100 of FIG. 1.

A memory cell set (e.g., 171 or 173) having a predetermined number 165 of memory cells (e.g., 175 to 176, or 177 to 178) is addressed for the storing a data item 151 of the predetermined size 152, independent of the format/encoding used to store the data item 151 in the memory cell set (e.g., 171 or 173).

Optionally, memory cells (e.g., 175 to 176, or 177 to 178) in a memory cell set (e.g., 171, or 173) can be configured to be accessible in parallel. For example, the memory cells (e.g., 177 to 178) in the set (e.g., 173) can be on a same column or row in the array 133 and share a common voltage driver (e.g., bitline driver 147 or wordline driver 145) for parallel access.

To store the data item 151 in a memory cell set (e.g., 171 or 173), the data item 151 can be encoded with redundant information (e.g., parity bits) to facilitate error recovery and to avoid read retry and read failure. Different encoding schemes can be used to provide different amounts of redundant information and thus varying levels of capabilities to recover from errors.

Increasing the amount of redundant information provided through encoding can reduce the rate of failure in error recovery in some instances. For example, one encoding option can generate an encoded data item 161 for programming into a memory cell set (e.g., 171 or 173); and another encoding option can generate another encoded data item 163 that has a size 164 larger than the size 162 of the encoded data item 161.

The increased size of the encoded data item 163 can be accommodated for storing in the addressed memory cell set (e.g., 171 or 173) by changing the programming mode of the memory cell set (e.g., 171 or 173) to store more bits per memory cell. The storage capacity provided by a memory cell set (e.g., 171 or 173) can be adjusted by its programming mode (e.g., to store one bit per memory cell, to store more than one bit per memory cell).

Increasing the storage capacity of a memory cell set (e.g., 171) may increase the bit error rate in retrieving the encoded data item (e.g., 163) from the memory cell set (e.g., 171). The increased bit error rate can offset the benefit of increased amount of redundant information in part or completely. Further, reading the memory cell programmed with an increased storage capacity can take more operations and thus a longer time than reading the memory cell programmed with a lesser storage capacity, before the retrieved data is to be decoded for error detection and recovery.

In general, an option to program with increased storage capacity and more redundant information can improve the performance of obtaining the data item 151 back from the programmed memory cell set (e.g., 171 or 173) in some instances; and in other instances, increasing the storage capacity for storing more redundant information may not improve the performance and/or can degrade the performance.

A predictive model 155 can be trained to predict whether an increased storage capacity with more redundant information can improve the performance of retrieving the data item 151 back from the memory cell set (e.g., 171). The prediction can be made based on features 153 of the memory region 170 and/or a memory cell set (e.g., 171) to be used to store the data item 151.

For example, the predictive model 155 can be implemented using an artificial neural network that identifies, based on the features 153, a data recovery option 157 and/or a programming mode (e.g., 172 or 174) for storing the data item 151 in the memory cell set (e.g., 171) in the form of an encoded data item (e.g., 161 or 163).

The features 153 can include statistical parameters about the past usages of the memory region 170, such as the ratio between read operations and write operations performed in the memory region 170, the average time between write operations in the memory region 170, the average time between read operations in the memory region 170, etc. In general, usage parameters indicative of impact on bit error rate in the memory region 170 can be used as part of the features 153.

Further, the features 153 can include attributes of the memory cell set (e.g., 171) to be used to store the data item 151, such as the address or location of the memory cell set (e.g., 171) in the memory region 170, an indication of the electrical distance of the memory cell set (e.g., 171) to voltage drivers for the memory cells (e.g., 175 to 176) in the memory cell set (e.g., 171), etc.

The features 153 can also include parameters indicative of the age of the memory cells (e.g., 175 to 176, 177 to 178), such as the average count of write operations performed in a typical memory cell in the memory region 170.

Based on the data recovery option 157 identified by the predictive model 155, an encoder 159 generates an encoded data item (e.g., 161 or 163) for the data item 151 with redundant information configured according to the data recovery option 157. Different data recovery options can result in different encoded data items (e.g., 161, 163) having different sizes (e.g., 162, 164). A corresponding programming mode (e.g., 172 or 174) that allows the memory cell set (e.g., 171) to store the encoded data item (e.g., 161 or 163) is selected and used to program the memory cell set (e.g., 171).

For example, the encoded data item 161 is generated to include less redundant information than the encoded data item 163. Thus, the size 162 of the encoded data item 161 is smaller than the size of the encoded data item 163. The encoded data item 161 can be stored in the memory cell set 171 in a mode of one bit per memory cell; and the encoded data item 163 can be stored in the memory cell set 171 in a mode of more than one bit per memory cell.

FIG. 4 illustrates an example of selecting between two encoding options usable to generate the encoded data items 161 and 163. In general, more than two options can be used to generate encoded items having more than two sizes that can be accommodated by more than two programming modes.

For example, in one implementation, a memory cell set 171 can be programmed to store less or no redundant information in a mode of storing one bit per memory cell, or to store more redundant information in a mode of storing three bits per two memory cells.

For example, in another implementation, a memory cell set 171 can be programmed to store less or no redundant information in an SLC mode, or to store more redundant information in a mode of storing three bits per two memory cells, or to store even more redundant information in an MLC mode.

For example, in a further implementation a memory cell set 171 can be programmed to store less or no redundant information in a first mode of storing a first number of bits per memory cell, or to store more redundant information in a second mode of storing a second number of bits per memory cell, where the second number is larger than the first number.

For example, the size of a memory cell set (e.g., 171) addressable to store a data item 151 can be configured to be a predetermined number 165 of memory cells (e.g., 175 to 176) so that the memory cell set (e.g., 171) is sufficient to store the smallest size (e.g., 162) of the encoded data items (e.g., 161, 163). An alternative programming mode (e.g., 174) provides an increased amount of storage capacity using the memory cell set (e.g., 171); and a data recovery option (e.g., 157) can be configured to use the increased capacity for redundant information (and optionally, other information useful in reading the memory cell set 171). The memory cell set (e.g., 171) having the predetermined number 165 of memory cells (e.g., 175 to 176) can be written/programmed as a group for a data item 151, and read as a group to recover the data item 151.

In general, different memory cell sets (e.g., 171, 173) in the memory region can be programmed in different modes (e.g., 172, 174) based on the prediction generated by the predictive model 155. As the usages of the memory region 170 changes and as the memory cells (e.g., 175 to 176, 177 to 178) age, the prediction of the predictive model 155 can adapt its predictions for storing a data item 151 in a memory cell set (e.g., 171) based on the current features 153.

In some implementations, the programming mode (e.g., 172 or 174) used to program a memory cell set (e.g., 171) is explicitly identified in the encoded data item (e.g., 161, 163). Thus, the memory device (e.g., 130) can read the identification of the programming mode from the memory cell set (e.g., 171) and determine the operations to read the encoded data item (e.g., 161 or 163), as illustrated in FIGS. 9 to 12.

In other implementations, the encoded data item (e.g., 161 or 163) may not include one or more bits explicitly identifying the programming mode (e.g., 172 or 174) of the memory cell set (e.g., 171); and the programming mode (e.g., 172 or 174) of the memory cell set (e.g., 171) can be inferred from statistics of memory cells programmed to a threshold voltage region, as illustrated in FIGS. 13 to 16.

Figure 14:
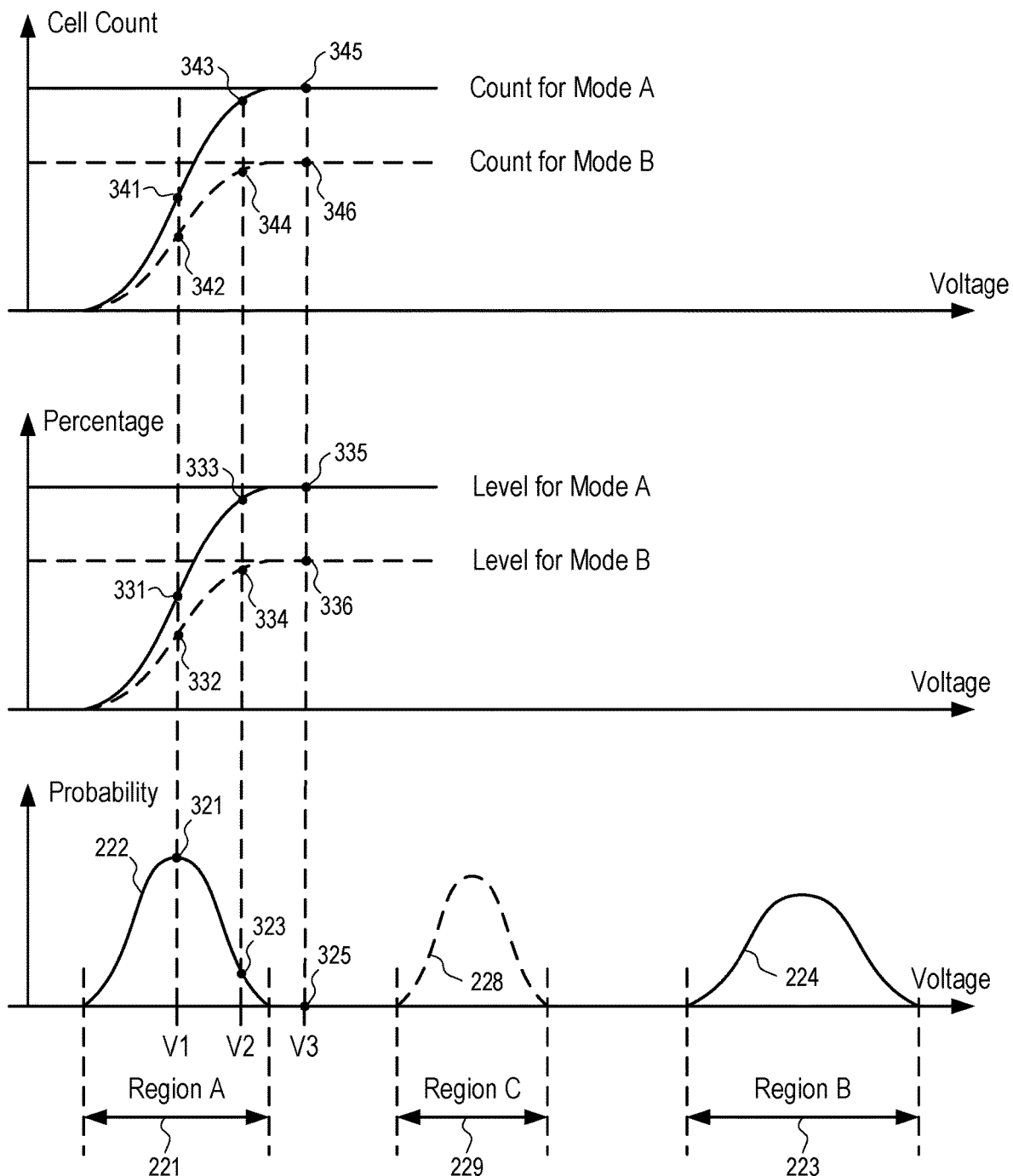
FIG. 14 illustrates a technique of incrementally increasing a voltage applied to a memory cell set to generate statistics usable in determination of a programming mode of the memory cell set according to one embodiment.

When the programming mode (e.g., 172 or 174) used to program the memory cell set (e.g., 171) is not explicitly identified in the encoded data item (e.g., 161, 163), the mapping from data values in encoded data item (e.g., 161 or 163) and the voltage thresholds of the programmed memory cells can be configured to have different statistical patterns for different programming mode. The statistical patterns can be used to determine the programming mode (e.g., 172 or 174), as illustrated in FIG. 14.

Optionally, an encoded data item (e.g., 161 or 163) can include parameters usable to improve the accuracy in reading the memory cell set 171 using a voltage of reduced magnitude, such as a count or percentage of memory cells programmed to have threshold voltages in a voltage region.

After the programming mode (e.g., 172 or 174) of the memory cell set (e.g., 171) is determined from a portion of the memory cells, or a statistical pattern of the memory cell set (e.g., 171) responding to a voltage, the memory device 130 can complete the read of the memory cell set (e.g., 171) according to the programming mode (e.g., 172 or 174).

Figure 5:
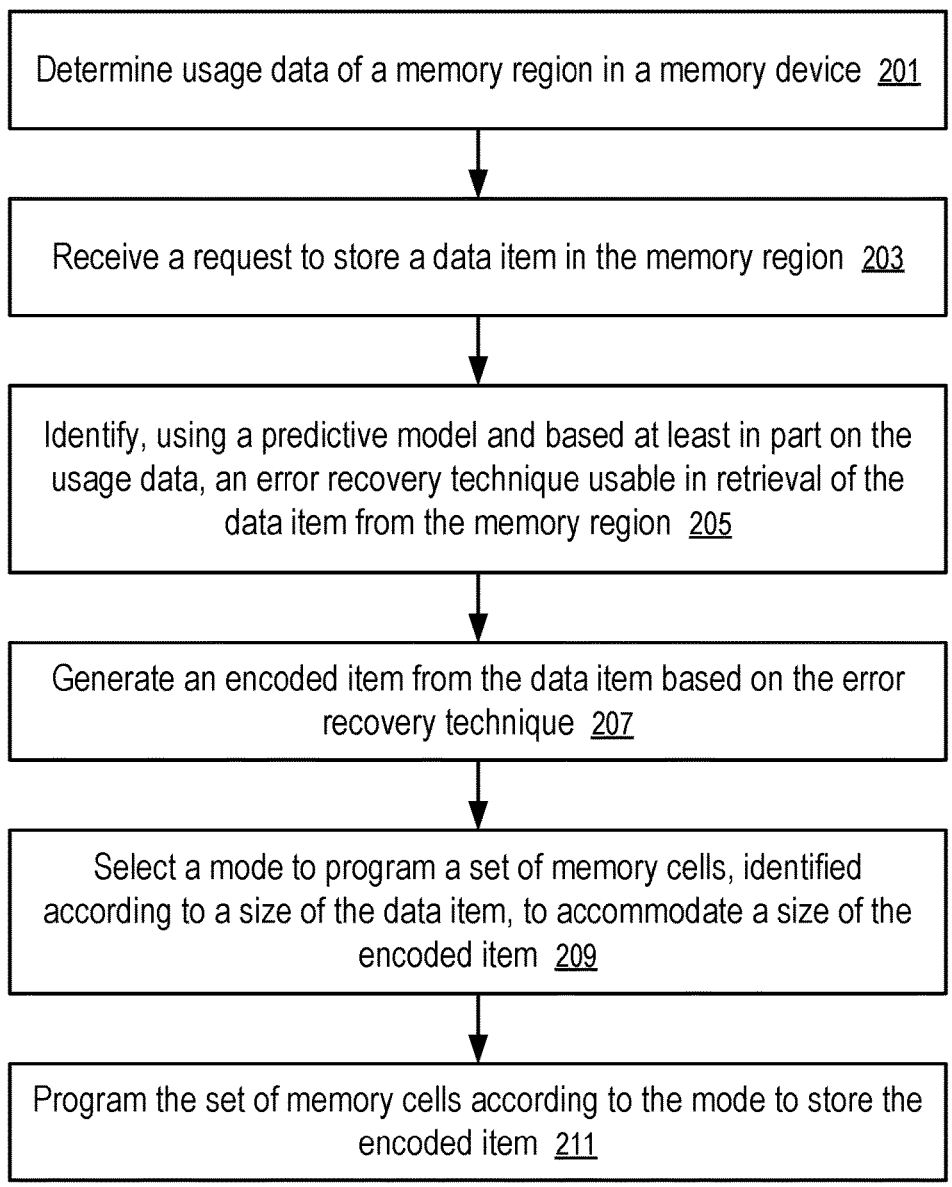
FIG. 5 shows a method to adaptively or selectively use a programming mode of a set of memory cells to store data according to one embodiment.

FIG. 5 shows a method to adaptively or selectively use a programming mode of a set of memory cells to store data according to one embodiment. For example, the method of FIG. 5 can be implemented in a computing system 100 of FIG. 1 and/or a memory device 130 of FIG. 2. For example, the method of FIG. 5 can be implemented using the technique of FIG. 4.

At block 201, a programming manager 113 determines usage data of a memory region 170 in a memory device 130.

For example, the usage data can include a read to write ratio of operations performed in the memory region 170 in a recent period of time.

For example, the usage data can include a bit error rate in recent operations of reading data from the memory region 170.

For example, the usage data can include a count of average write operations performed on a typical memory cell in the memory region 170, an average time between write operations performed on the typical memory cell, etc.

At block 203, the programming manager 113 receives a request to store a data item 151 in the memory region 170.

For example, the request can identify an address that corresponds to a memory cell set 171 having a predetermined number 165 of memory cells 175 to 176.

At block 205, the programming manager 113 identifies, using a predictive model 155 and based at least in part on the usage data, an error recovery technique (e.g., data recovery option 157) usable in retrieval of the data item 151 from the memory region 170.

For example, the data recovery technique (e.g., data recovery option 157) can include an error correction code (ECC) technique, such as a Low-Density Parity-Check (LDPC) code, where the amount of redundant information can be selected based on the usage data for improved performance in retrieving the data item 151 from the memory region 170.

For example, the predictive model 155 can use features of the memory region 170 to identify the desired data recovery option 157 for storing the data item 151 in a memory cell set (e.g., 171). The features can include not only the usage data, but also the attributes of the memory cell set (e.g., 171), such as the address/location of the memory cell set (e.g., 171) in the memory region 170.

Optionally, the predictive model 155 is configured to predict a bit error rate in reading the memory cell set (e.g., 171); and the data recovery technique, or the selected data recovery option 157, can be selected based on the bit error rate predicted by the predictive model 155. For example, when the bit error rate is predicted to be within a first range, the encoded data item 161 is used for storing the data item 151; and when the bit error rate is predicted to be within a second range, the encoded data item 163 is used for storing the data item 151.

At block 207, an encoder 159 generates an encoded item (e.g., encoded data item 161 or 163) from the data item 151 based on the error recovery technique identified using the predictive model 155.

At block 209, the programming manager 113 selects a mode (e.g., 172 or 174) to program a set of memory cells (e.g., memory cell set 171 or 173) to accommodate a size (e.g., 162 or 164) of the encoded item (e.g., item 161 or 163). Preferably, the set of memory cells (e.g., set 171 or 173) is identified according to a size 152 of the data item 151, not based on the size (e.g., 162 or 164) of the encoded item (e.g., item 161 or 163). In some implementations, the programming mode (e.g., 172 or 174) is also suggested by the predictive model 155 for the identified data recovery option 157.

By adjusting the programming mode of the memory cell set 171, the set 171 of memory cells 175 used to store the data item 151 can be independent of the identification of the data recovery technique or the data recovery option 157. The mode in which the memory cell set (e.g., 171) is programmed to store the encoded data item (e.g., 161 or 163) can be based on the data recovery technique or the data recovery option 157, in view of the size (e.g., 162 or 164) of the encoded data item (e.g., 161 or 163).

For example, the data item 151 has a predetermined size 152; and the memory cell set 171 has a predetermined number 165 of memory cells 175 to 176 for storing the data item 151 of the predetermined size, regardless of the data recovery option 157 used. The memory region 170 has multiple memory cell sets (e.g., 171, . . . , 173), each having the same predetermined number 165 of memory cells (e.g., 175 to 176, or 177 to 178). Optionally, the usage data in the features 153 used as the input to the predictive model 155 is based on at least a portion of memory cells in the memory region 170 not included in the memory cell set (e.g., 171) used to store an encoded data item (e.g., 161 or 163) that is representative of the data item 151.

For example, the mode for programming the memory cell set 171 can be selected from at least a first mode of storing one bit per memory cell and a second mode of storing more than one bit per memory cell, such as a mode of storing three bits per two memory cells.

At block 211, a controller (e.g., 131 or 150) of the memory device 130 programs the set of memory cells (e.g., set 171 or 173) according to the selected mode (e.g., 172 or 174) to store the encoded item (e.g., item 161 or 163).

As a result of adaptively selecting a programming mode of the memory cell set 171 in response to a command to store the data item 151, the memory region 170 can have memory cell sets (e.g., 171, 173) programmed in different modes (e.g., 172, 174). The features 153 about the memory region 170 do not identify the memory region 170 as having been programmed in a specific mode.

Alternatively, the memory region 170 can be configured to use a same programming mode. The predictive model 155 is used to determine whether the programming mode for memory cells (e.g., 175 to 176, . . . , 177 to 178) is to be changed to accommodate a different data recovery option 157. When the new data recovery option 157 is selected, the memory device 130 can refresh the memory region 170 to the new data recovery option 157, by retrieving the data items (e.g., 151) stored in memory cell sets (e.g., 171), generating the updated, encoded data item (e.g., 161 or 163) from the retrieved data item 151, and reprogramming the memory cell set (e.g., 171) to store the updated, encoded data item (e.g., 161 or 163).

In addition to the dynamic configuration of the storage capacity of a memory cell set 171 to accommodate more redundant information for storing a data item 151 of a predetermined size 152, the memory device 130 can dynamically change the programming mode applied to a memory cell set 171 for other applications. For example, a compressed data item takes time and resources in decompression. In some instances, instead of storing a compressed data item 151, the computing system 100 can choose to store an uncompressed version of the data item 151 using the same memory cell set 171 with a programming mode that offers increased storage capacity for the uncompressed data. In other instances, an application program can be configured to temporary increase the amount of data to be stored into the memory region and thus, selectively increase the storage capacity of some of the memory cell sets (e.g., 171) by using a programming mode to store more bits per memory cell.

Figure 6:
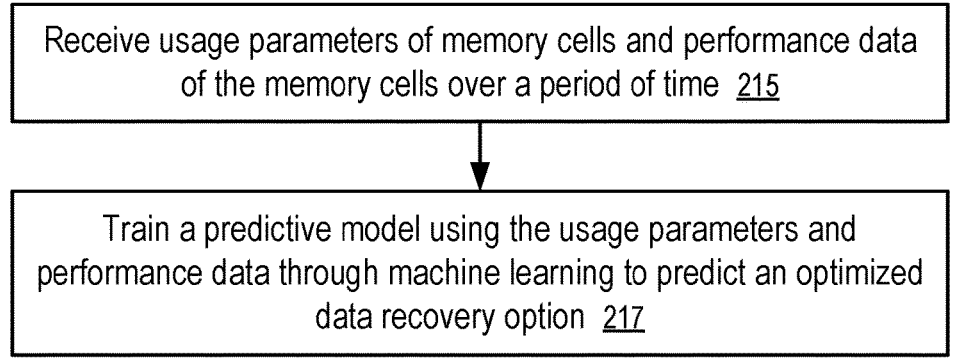
FIG. 6 shows a method to generate a predictive model for performance improvement via selection of programming mode according to one embodiment.

FIG. 6 shows a method to generate a predictive model for performance improvement via selection of programming mode according to one embodiment. For example, the method of FIG. 6 can be implemented in a computing system 100 of FIG. 1 and/or a memory device 130 of FIG. 2.

At block 215, a programming manager 113 receives or collects usage parameters of memory cells (e.g., 101) and performance data of the memory cells (e.g., 101) over a period of time.

For example, the usage parameters can be similar to those used to make the prediction or selection of the data recovery option 157. The usage parameters can be collected for various usage patterns of read and write operations performed on the memory cells, including programming the memory cells in different programming modes (e.g., storing one bit per cell, and storing more than one bit per cell).

For example, the performance data can include measurements of the average time to successfully retrieve a data item stored in the memory cells without error (e.g., after decoding), the average count of read retry, etc., as a result of different usage patterns and programming modes.

At block 217, the programming manager 113 trains a predictive model 155 using the usage parameters and performance data through machine learning to predict an optimized data recovery option 157.

For example, the predictive model 155 is configured to predict, based on current usage parameters of the memory cells at a time during the period, whether a change to storing data in the memory cells using an error correct technique with an increased number of bits stored per memory cell improves read performance in a subsequent usage of the memory cells after the time.

For example, the machine learning can be applied to train the predictive model 155 in predicting, for a given set of usage parameters at a point in time, the performance level of the memory cells in data retrieval for a given programming mode by reducing the different between the prediction and the performance data of the memory cells measured in the period of time. For a given set of usage parameters, the preference levels of different programming modes associated with different data recovery options can be predicted and compared to select an optimized data recovery option 157.

For example, the predictive model 155 can include an artificial neural network trained using a supervised machine learning technique to predict a performance level of a programming mode having an associated data recovery option. The performance level corresponds to a bit error rate in reading data programmed using the programming mode.

For example, the predictive model 155 can be configured to predict a first bit error rate in the memory cells with a change to the current programming mode used in the past, and a second bit error rate in the memory cells without the change. The predicted bit error rates can be used to calculate the corresponding read performance levels with or without the change. When the predicted performance level with the change is better, the predictive model 155 can provide an output to suggest the change.

The training of the predictive model 155 can be performed in the computing system 100 in which the data programming operation is controlled via the predictive model 155. Such an arrangement allows the predictive model 155 to be trained based on the actual usage pattern in the computing system 100.

Alternatively, the usage data and performance data can be collected from memory devices similar to the memory device 130 and trained according to typical usage patterns to predict an optimized data recovery option 157.

In some implementations, the operations of the programming manager 113 discussed above are implemented in the controller 150 or 131 of the memory device 130. Alternatively, at least some of the operations can be performed in the programming manager 113 configured in a memory sub-system controller 115, and/or in a host system 120.

Figure 7:
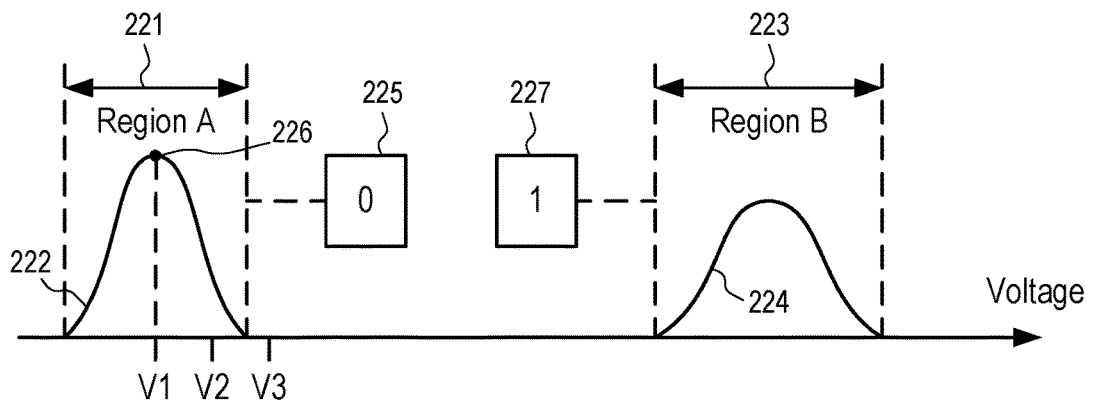
FIG. 7 illustrates techniques associated with programming a memory cell in a mode to store a bit per cell according to one embodiment.

FIG. 7 illustrates techniques associated with programming a memory cell in a mode to store a bit per cell according to one embodiment. For example, the techniques of FIG. 7 can be used to implement a mode 172 of data programming for a memory cell (e.g., 175 or 176, or 177 or 178) in FIG. 4.

In FIG. 7, the threshold voltage of a memory cell 101 in a memory device 130 is programmed to be in one of two voltage regions: a lower voltage region 221 and a high voltage region 223. The lower voltage region 221 is used to represent a first bit value 225 (e.g., zero); and the higher voltage region 223 is used to represent a second bit value 227 (e.g., one).

To store the first bit value 225 in the memory cell 101, a programming voltage pulse or pattern can be applied to the memory cell 101 such that its threshold voltage moves into the lower voltage region 221. Similar, to store the second bit value 225 in the memory cell 101, a programming voltage pulse or pattern can be applied to the memory cell 101 such that its threshold voltage moves into the higher voltage region 223.

To determine the bit value stored in the memory cell 101, one or more read voltages can be applied to the memory cell 101 to test whether the threshold voltage in the higher voltage region 223, or the lower voltage region 221. The identification of which of the lower voltage region 221 and the high voltage region 223 contains the threshold voltage of the memory cell 101 provides the associated bit value (e.g., 225 or 227) stored in the memory cell 101.

For example, a read voltage between the lower voltage region 221 and the higher voltage region 223 can be applied to determine whether the memory cell 101 is in a conductive state or in a non-conductive state. If the memory cell 101 is in a conductive state, the threshold voltage of the memory cell 101 is lower than the applied read voltage; and thus in the lower region 221. Therefore, the memory cell 101 is storing the first value 225 associated with the lower region 221. Otherwise, the threshold voltage is in the higher voltage region 223; and the memory cell 101 is storing the second value 227 associated with the higher voltage region 223.

In general, after a programming operation to store a bit of data in the memory cell 101, the threshold voltage of the memory cell 101 has different probabilities of being at different locations within a voltage region (e.g., the lower voltage region 221, or the higher voltage region 223). FIG. 7 illustrates distributions 222 and 224, where a point (e.g., 226) on the distribution (e.g., 222 or 224) identifies the level of probability of the threshold voltage of the memory cell 101 being at the voltage (e.g., V1) at the point (e.g., 226).

In some instances, the distributions 222 and 224 can drift due to various reasons. In some instances, it is desirable to use the lowest voltage to read the memory cell 101 (e.g., to avoid or reduce the side effect of the read voltage on the state of the memory cell 101 and/or other memory cells).

A technique to read the memory cell 101 is based on a statistics of the states of memory cells (e.g., 175 to 176) in a memory cell set (e.g., 171) encoded to store data according to a pattern. For example, the memory cells 175 to 176 in the memory cell set 171 are programmed together and read together for the data item 151. Further, the memory cells 175 to 176 are close to each other in a memory region. Thus, the memory cells 175 to 176 can be assumed to have similar distributions 222 and 224 and have similar changes or drifts in the distributions 222 and 224. The memory cells 175 to 176 can be read using a read voltage having a magnitude that is increased incrementally from low to high (e.g., from V1, to V2, to V3). At each increment (e.g., V1), the results of the bit values stored in the memory cells as determined via the read voltage (e.g., V1) can be compared to the known pattern or statistics. When the read voltage is increased to a level (e.g., V3) where the results match with the known pattern or statistics, the results obtained at the read voltage can be accepted.

For example, the pattern or statistics can be the ratio between a count of memory cells in the memory set (e.g., 171) that have threshold voltages programmed in the voltage region 221 and a count of memory cells in the memory set (e.g., 171) that have threshold voltages programmed in above the voltage region 221. As the read voltage is ramped up from V1, to V2, etc., more and more of the memory cells having threshold voltages programmed in the voltage region 221 become conductive. When the ratio of conductive memory cells and non-conductive memory cells reaches the value corresponding to the expected pattern or statistics (e.g., at V2 or V3), the applied read voltage is sufficient to identify all of the memory cells having threshold voltages programmed into the region 221. Thus, the conductive memory cells at the read voltage (e.g., V2 or V3) are memory cells storing the value 225; and the other memory cells store the value 227.

For example, the encoded data item (e.g., 161 or 163) stored in the memory cell set 171 can be a codeword having equal numbers of cells programmed to the lower voltage region 221 and cells programmed to the high voltage region 223. Thus, when the read voltage is ramped from V1 towards V3 to a point (e.g., V2) that causes equal numbers of memory cells in the memory cell set 171 to be in a conductive state and in a non-conductive state, the memory cells having the conductive state can be determined to have stored therein the value 225 associated with the lower voltage region 221; and the remaining memory cells in the memory cell set 171 can be determined to have stored therein the value 227 associated with the higher voltage region 223.

In another example, the memory cell set 171 is configured to store an indicator of a count of memory cells programmed to have threshold voltages in the lower voltage region 221. Thus, when the read voltage is ramped (e.g., from V1 towards V3) to a point (e.g., V2 or V3) that causes the count of memory cells in the memory cell set 171 to be in a conductive state, the memory cells having the conductive state can be determined to have stored therein the value 225 associated with the lower voltage region 221; and the remaining memory cells in the memory cell set 171 can be determined to have stored therein the second value 227 associated with the higher voltage region 223. Alternative, the count of memory cells programmed to have threshold voltages in the lower voltage region 221 is predetermined in the encoding scheme; and thus, the memory device 130 does not have to rely upon reading at least a portion of the memory cell set 171 to determine the count.

Figure 8:
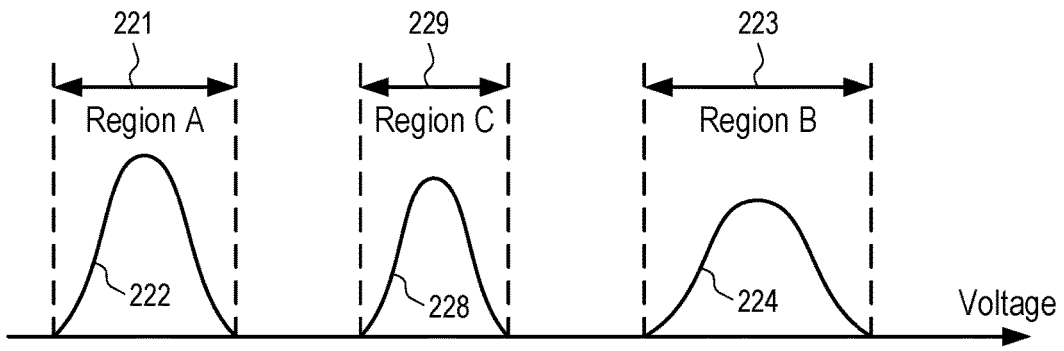
FIG. 8 illustrates techniques associated with programming two memory cells in a mode to store three bits per two cells according to one embodiment.
Figure 8:
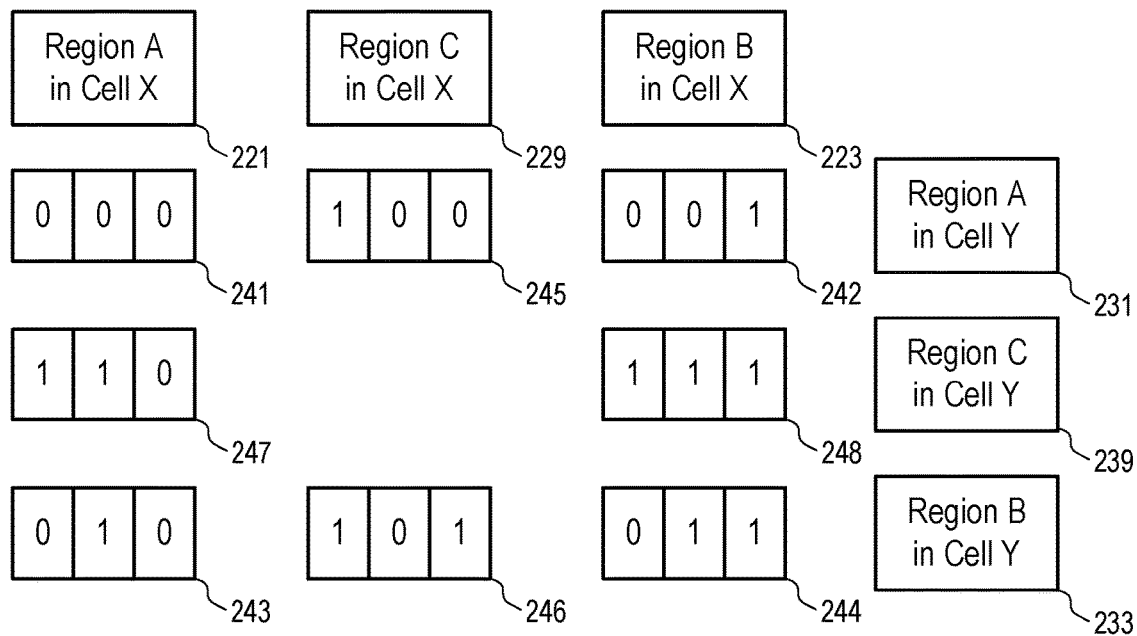

FIG. 8 illustrates techniques associated with programming two memory cells in a mode to store three bits per two cells according to one embodiment. For example, the techniques of FIG. 8 can be used to implement a mode 174 of data programming for a memory cell (e.g., 175 or 176, or 177 or 178) in FIG. 4, while the techniques of FIG. 7 are used to implement another mode 172 of data programming for the memory cell (e.g., 175 or 176, or 177 or 178) in FIG. 4.

Compared to FIG. 7, a memory cell 101 programmed according to FIG. 8 can have its voltage threshold configured in a middle voltage region 229 that is separate from a lower voltage region 221 and a higher voltage region 223. Thus, the voltage threshold of the memory cell 101 can be in three different voltage regions: the lower voltage region 221, the middle voltage region 229, and the higher voltage region 223, having corresponding probability distributions 222, 228, and 224 respectively.

In some embodiments, the lower voltage region 221 configured for mode 172 is substantially the same as the lower voltage region 221 for mode 174. Thus, the result of testing which memory cells have threshold voltages in the lower voltage region 221 can be used for both mode 172 and mode 174; and the operations for such a test can be configured as common operations for reading the memory cell set 171 programmed in mode 172 and in mode 174. For example, the programming pulse configured to place the threshold voltage of a memory cell 101 in the lower voltage region 221 in mode 172 of storing one bit per memory cell can also be used to place the threshold voltage of the memory cell 101 in the lower voltage region 221 in mode 172 of storing three bits per two memory cells.

When two memory cells X and Y are used together, the two memory cells offer nine possible combinations of voltage regions in which the threshold voltages of the memory cells can be located. The possible combinations can be used to represent different bit values of a three-bit data items, as illustrated in FIG. 8.

In the example illustrated in FIG. 8, when the threshold voltage of the memory cell Y is in a lower voltage region 231, the threshold voltage of the memory cell X being in the lower voltage region 221, the middle voltage region 229, and the higher voltage region 223 can be used to represent bit values 241, 245 and 242 respectively (e.g., bit values "000", "100", and "001"). When the threshold voltage of the memory cell Y is in a higher voltage region 233, the threshold voltage of the memory cell X being in the lower voltage region 221, the middle voltage region 229, and the higher voltage region 223 can be used to represent bit values 243, 246 and 244 respectively (e.g., bit values "010", "101", and "011"). When the threshold voltage of the memory cell Y is in a middle voltage region 239, the threshold voltage of the memory cell X being in the lower voltage region 221, and the higher voltage region 223 can be used to represent bit values 247 and 248 respectively (e.g., bit values "110", and "111"). The memory cells X and Y are not programmed both to the middle voltage regions 229 and 229.

Thus, according to the bit values of a given three-bits data item, the threshold voltages of the memory cells X and Y can be programmed to the respective regions illustrated in FIG. 8 to represent the data item having the three bit values. To determine the bit values stored in the memory cells X and Y, the voltage regions containing the threshold voltages of the memory cells X and Y can be tested via application of read voltages; and the identifications of the voltage regions containing the threshold voltages of the memory cells X and Y can be used to determine the corresponding bit values as illustrated in FIG. 8.

The detection of the voltage region in which the threshold voltage of a memory cell (e.g., X or Y) is located can be performed using techniques similar to the detection of voltage region of a memory cell programmed in the mode of one bit per cell (e.g., illustrated in FIG. 7).

For example, a read voltage between two voltage regions (e.g., between lower voltage region 221 and middle voltage region 229, or between middle voltage region 229 and higher voltage region 223) can be applied to determine whether the threshold voltage of the memory cell is in the region (e.g., 221 and/or 229) below the read voltage. Alternatively, the read voltage can be ramped up for a group of memory cells (e.g., memory cell set 171 or 173) programmed in the same mode until a pattern or a statistic measurement of the read result of the group matches with a known pattern or count.

Figure 9:
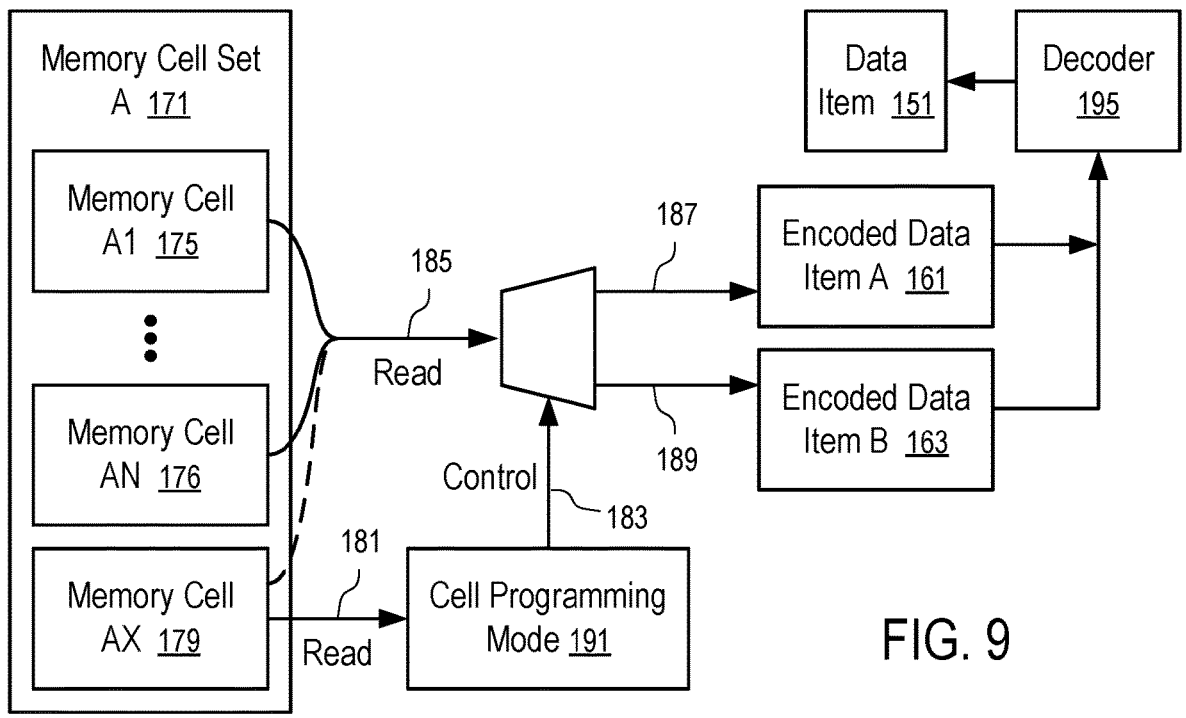
FIG. 9 illustrates a technique to use a memory cell to indicate a programming mode of a memory cell set according to one embodiment.

FIG. 9 illustrates a technique to use a memory cell to indicate a programming mode of a memory cell set according to one embodiment. For example, the technique of FIG. 9 can be used to read a memory cell set 171 or 173 in FIG. 4.

In FIG. 9, a memory cell set 171 includes memory cells 175, ..., 176 and 179. An indicator of the programming mode 191 of the memory set cell 171 can be stored as a bit in a memory cell 179.

The read operation 181 to obtain the cell programming mode 191 can be performed in parallel with an initial read operation 185 in determining the values stored in at least the memory cells 175, ..., 176. The initial read operation 185 is common to the reading of the memory cell set 171 programmed in different modes. Thus, the determination of the cell programming mode 191 from the memory cell 179 causes no delay or minimized delay.

After the programming mode 191 of the memory cell set 171 is obtained via a read operation 181, the programming mode 191 can be used to control 183 which of the read operations 187 and 189 is to be performed. The read operations 187 and 189 are configured for the programming modes 172 and 174 respectively. The read operations 187 and 189 result in different encoded data items 161 and 163 of different sizes 162 and 164 (e.g., as illustrated in FIG. 4). When the bit error rates in the encoded data items 161 and 163 are sufficiently low, a decoder 195 can generate the data item 151 from either of the encoded data items 161 and 163.

Optionally, the memory cell 179 is programmed in a fixed mode of storing one bit per cell to indicate whether the remaining memory cells 175 to 176 are programmed in a first mode (e.g., one bit per cell) or in a second mode (e.g., three bits per two cells). When the memory cell 179 is programmed in the mode of one bit per cell, the value stored in the memory cell 179 can be retrieved at a read voltage suitable to determine whether the threshold voltages of the memory cells 175, ..., 176 and 179 are in a low voltage region 221 illustrated in FIGS. 7 and 8. Thus, further testing of the threshold voltages of the memory cells can be performed when necessary (e.g., when the programming mode 191 indicates that some of the memory cells may be in the middle voltage region 229 specific to the mode 174 of storing three bits per two cells).

Optionally, the memory cell 179 is programmed in the same mode as the remaining memory cells 175 to 176 in the memory cell set 171. For example, when programmed in a mode of storing three bits per two cells, the memory cells 179 and 179 are paired to store three bits. In such an embodiment, the association of the voltage regions of the memory cells and the programming mode of the memory cell set 171 can be configured such that the mode of the memory cell set 171 can be determined from the read voltage usable to determine whether the threshold voltages of the memory cells 175, ..., 176, and 179 are in the lower voltage region 221.

For example, when the memory cell set 171 is programmed in a mode 172 of storing one bit per cell, the threshold voltage of the memory cell 179 is programmed to the lower voltage region 221. When the memory cell set 171 is programmed in a mode 174 of storing three bits per two cells, the threshold voltage of the memory cell 179 is not in the lower voltage region 221. Thus, the programming mode of the memory cell set 171 can be determined in the process of reading the memory cells 175, ..., 176, and 179, with no overhead or minimized overhead in operation time.

Figure 10:
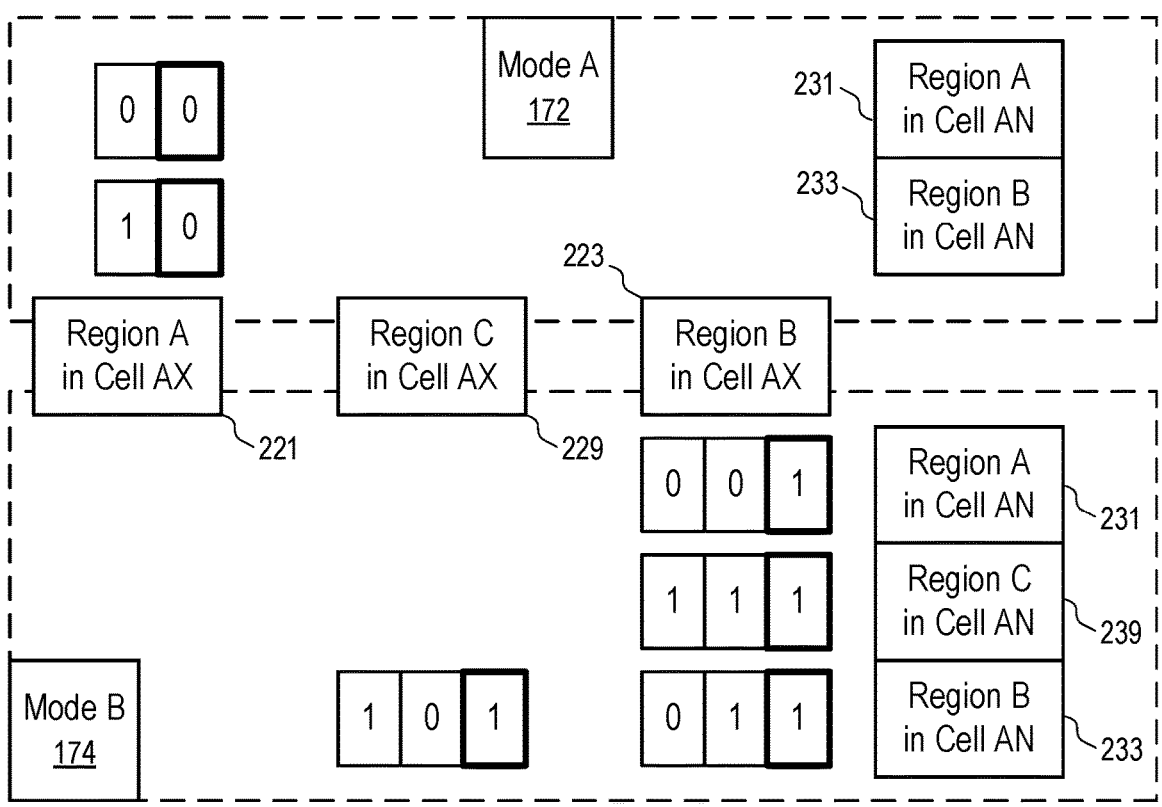
FIG. 10 illustrates an example of encoding data to support reading a memory cell set that can be programmed in one of two possible modes according to one embodiment.

For example, the data values stored in the memory cells 176 and 179 can be configured for a mode 172 of storing one bit per cell and a mode 174 of storing three bits per two cells in a way as illustrated in FIG. 10.

FIG. 10 illustrates an example of encoding data to support reading a memory cell set that can be programmed in one of two possible modes according to one embodiment.

In FIG. 10, the last bit of the encoded data item 161 or 163 is highlighted and used to indicate the cell programming mode 191.

When the memory cells AN and AX (e.g., 176 and 179 in FIG. 9) are programmed in a mode 172 of storing one bit per cell, the last bit of the encoded data item 161 is configured to store a value of zero (0); and the memory cell AN is configured to store a further bit of the encoded data item 161. The value of zero (0) assigned to the last bit of the encoded data item 161 cause the memory device 130 to program the threshold voltage of the memory cell AX into the lower voltage region A (e.g., 221 in FIGS. 7 and 8). Thus, when in the mode 172 of storing one bit per memory cell, the threshold voltage of the memory cell AX is programmed neither to the middle region C (e.g., 229 in FIGS. 7 and 8) nor to the higher voltage region B (e.g., 223 in FIGS. 7 and 8).

When the memory cells AN and AX are programmed in a mode 174 of storing three bits per two cells, the last bit of the encoded data item 163 is configured to store a value of one (1). As a result, the memory cell AX cannot have its threshold voltage programmed in the lower voltage region A in the mode 174. Four combinations of the threshold voltage locations in regions C and B for memory cell AX and regions A, C and B for memory cell AN can be used to present the different values of the next two bits positioned before the last bit of one (1).

In reading the memory cell set 171 AX and AN, the memory device 130 first tests whether the threshold voltages of the memory cell set 171, including memory cell AX 179, are in the low voltage region A. Such a test corresponds to the read operations 185 and 181 in FIG. 9. The result of this test is sufficient to determine the cell programming mode 191. If the threshold voltage of the memory cell AX is in the lower voltage region 221, the programming mode 191 of the memory cell set 171 is mode 172 of storing one bit per memory cell; otherwise, the programming mode 191 is mode 174 of storing three bits per two memory cells.

If the detected cell programming mode 191 is the mode 172, no further test of the threshold voltage is necessary, since the result is sufficient to infer which memory cells in the memory cell set 171 have threshold voltages in the higher voltage region B. Thus, the encoded data item 161 can be determined.

If the detected cell programming mode 191 is the mode 174, a further test of the threshold voltage is necessary to determine which memory cells have threshold voltages in the middle voltage region C and in the upper voltage region B. For example, another test voltage between the voltage regions C and B can be applied to determine which of the memory cells that have threshold voltages higher than the lower voltage region A have threshold voltages lower than the test voltage and thus in the middle voltage region C. Memory cells having threshold voltages higher than the test voltage have threshold voltages in the higher voltage region B. The identifications of the voltage regions for the threshold voltages of the memory cells can be mapped to the bit values of the encoded data item 163.

In some implementations, the memory cells 175, ..., 176 and 179 are implemented as self-selecting memory cells each having a selector/memory device. Such memory cells can be read in either polarities. When a memory cell is programmed to have a threshold voltage in a higher voltage region B in one polarity, the memory cell has a threshold voltage in a lower voltage region in the opposite polarity. Thus, after determining that the memory cell set 171 is programmed in the mode 174 of storing three bits per two cells, the memory device 130 can alternatively apply the read voltage in the opposite polarity to determine which memory cells in of memory cell set 171 have thresholds voltages in a lower voltage region in the opposite polarity, which corresponds to the higher voltage region B. Such an arrangement can reduce the magnitude of read voltages used to read the memory cell set 171.

Optionally, test voltages can be applied in increments. At each increment, the statistics or patterns of the test result can be compared with a known count or pattern to determine whether the magnitude of the test voltage is sufficiently high to detect or identify all of the memory cells that are programmed into a voltage region, in a way similar to that as discussed above in connection with FIG. 7. When there is a match, the result can be accepted for the voltage region below the current test voltage.

Optionally, an indicator of the count or pattern is also stored in the memory cell set 171. Preferably, the count or pattern is encoded in the encoded data item (e.g., 161 or 163) in a way such that the count or pattern can be determined with or before the completion of application of increments for the current voltage region being tests, in a way similar to the determination of the cell programming mode 191.

Optionally, the indicator of the counter or pattern is stored as part of the encoded data item (e.g., 163) in the memory cell set 171 for one mode (e.g., 174), but as part of the encoded data item (e.g., 161) in another mode (e.g., 172).

Figure 11:
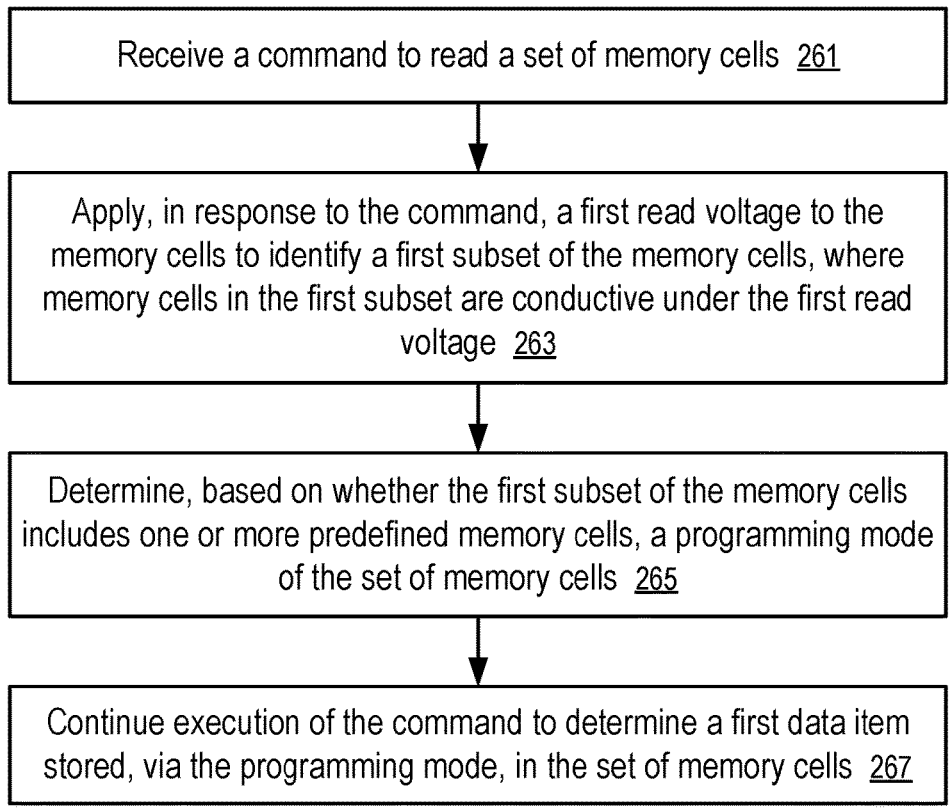
FIG. 11 shows a method to identify the programming mode of a set of memory cells according to one embodiment.

FIG. 11 shows a method to identify the programming mode of a set of memory cells according to one embodiment. For example, the method of FIG. 11 can be implemented in a computing system 100 of FIG. 1 and/or a memory device 130 of FIG. 2 using the techniques of FIGS. 7-10.

In FIG. 11, at block 261, a memory device 130 receives a command to read a set of memory cells (e.g., memory cell set 171).

For example, the memory device 130 has a controller 131, an array 133 of memory cells (e.g., 101), and voltage drivers (e.g., bitline drivers 137 and wordline drivers 135).

At block 263, the memory device 130 applies, in response to the command, a first read voltage to the memory cells (e.g., 175, ..., 176, and 179) to identify a first subset of the memory cells, where memory cells in the first subset are conductive under the first read voltage.

For example, the first read voltage can be configured between the lower voltage region 221 and the middle voltage region 229. Thus, identifying the first subset of the memory cells is the operation common to reading the memory cell set 171 programmed in the mode 172 of storing one bit per memory cell and reading the memory cell set 171 programmed in the mode 174 of storing three bits per two memory cells, as illustrated in FIG. 10.

For example, the controller 131 can cause the bitline drivers 137 and wordline drivers 135 to increase voltages, driven across the first memory cells 175, ..., 176, and 179 respectively, up to the first read voltage, causing the first subset to change from a non-conductive state to a conductive state.

When in a non-conductive state, a memory cell allows a leak current that is substantially smaller than a threshold current to go through the memory cell. When in the conductive state, the memory cell allows larger than the threshold current to go through the memory cell.

At block 265, the memory device 130 determines, based on whether the first subset of the memory cells includes one or more predefined memory cells, a programming mode of the set of memory cells.

In the example of FIG. 10, when the threshold voltage of the memory cell 179 is programmed in the lower voltage region A, the first subset of the memory cells that become conductive under the first read voltage (e.g., between the lower voltage region 221 and the middle voltage region 229) includes the memory cell 179. Therefore, a last bit stored in the memory cells AN and AX has the bit value of zero, which is an identification that the memory cell set 171 is programmed in the mode 172 of storing one bit per memory cell.

In the example of FIG. 10, when the threshold voltage of the memory cell 179 is not programmed in the lower voltage region A, the first subset of the memory cells that become conductive under the first read voltage (e.g., between the lower voltage region 221 and the middle voltage region 229) does not include the memory cell 179. Therefore, a last bit stored in the memory cells AN and AX has the bit value of one, which is an identification that the memory cell set 171 is programmed in the mode 174 of storing three bits per two memory cells.

At block 267, after the identification of the programming mode of the memory cell set 171, the memory device can continue execution of the command to determine a first data item stored, via the programming mode 191, in the set of memory cells. The subsequent operations can be different from different programming modes.

For example, when the programming mode 191 of the memory cell set 171 is the mode 172 of storing one bit per memory cell, the memory device 130 can determine that the remaining memory cells, in the memory cell set 171 but not in the first subset, are programmed to have threshold voltages in the higher voltage region 223, without applying further read voltages or test voltages. From the identifications of the regions in which the threshold voltages of the memory cells 175, ..., 176, and 179 are located, the bit values stored in the memory cells 175, ... 176, and 179 can be determined. The collection of bit values retrieved, read, determined from the memory cell set 171 provides the encoded data item 161. If the encoded data item 161 contains errors, the decoder 195 can detect one or more errors in the data item 161 and, when the bit error rate does not exceed the error recovery capability of the decoder 195, determine an error-free data item 151 that is previously stored/written/programmed into the memory cell set 171.

However, when the programming mode 191 of the memory cell set 171 is the mode 174 of storing three bits per two memory cells, the memory device 130 can continue increase the voltages driven on the memory cells 175, ..., 176, and 179 to a second read voltage that is, higher than the first read voltage. For example, the second read voltage can be configured between the middle voltage region 229 and the higher voltage region 223. The memory device 130 identifies a second subset of the memory cells that become conductive under the second read voltage. Based on the identification of the first subset and the second subset, the threshold voltage regions of the memory cells 175, ..., 176 and 179 can be determined. The memory device 130 identifies the bit values stored in the memory cells 175, ... 176, and 179 based on the threshold voltage regions of the memory cells 175, . . . , 176 and 179. The collection of bit values retrieved, read, determined from the memory cell set 171 provides the encoded data item 163. If the encoded data item 163 contains errors, the decoder 195 can detect one or more errors in the data item 163 and, when the bit error rate does not exceed the error recovery capability of the decoder 195, determine an error-free data item 151 that is previously stored/written/programmed into the memory cell set 171.

Figure 12:
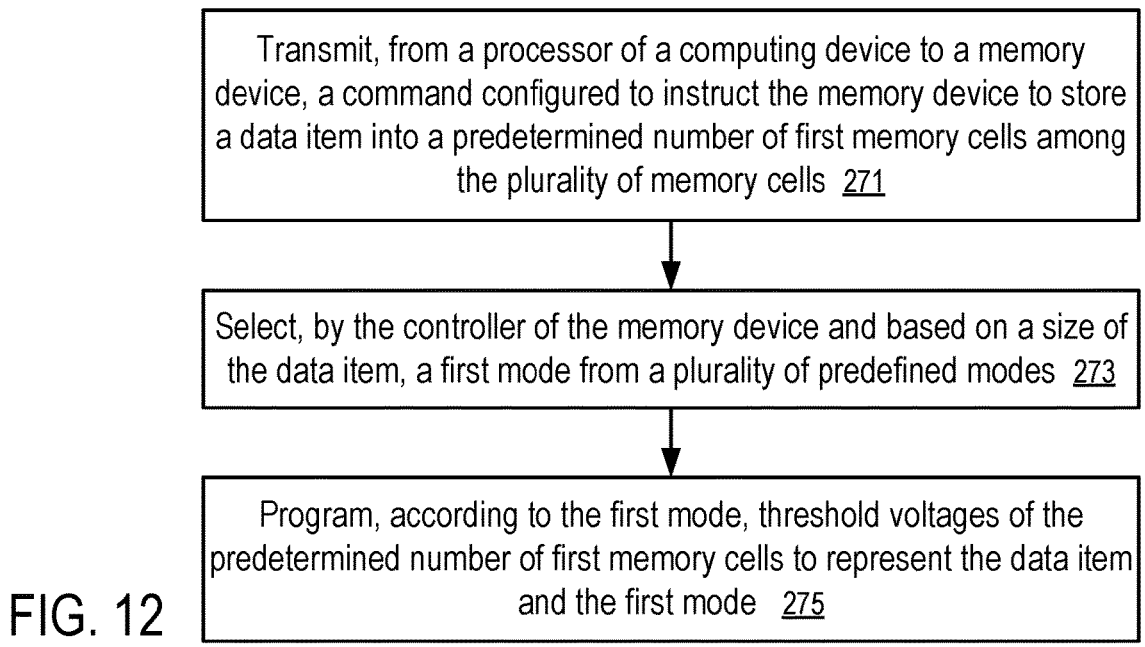
FIG. 12 shows a method to write data into a set of memory cells with an indicator of programming mode according to one embodiment.

FIG. 12 shows a method to write data into a set of memory cells with an indicator of programming mode according to one embodiment. For example, the method of FIG. 12 can be implemented in a computing system 100 of FIG. 1 and/or a memory device 130 of FIG. 2 using the techniques of FIGS. 7-10.

In FIG. 12, At block 271, a processor (e.g., a processing device 118 or 117) of a computing device (e.g., computing system 100 illustrated in FIG. 1) transmits to a memory device 130, a command configured to instruct the memory device 130 to store a data item (e.g., 161 or 163) into a predetermined number 165 of first memory cells 175, . . . , 176, 179 among a plurality of memory cells in the memory device 130.

At block 273, a controller 131 of the memory device 130 selects, based on a size (e.g., 162 or 164) of the data item (e.g., 161 or 163), a first mode from a plurality of predefined modes (e.g., 172, 174).

At block 275, the controller 131 programs, according to the first mode, threshold voltages of the predetermined number 165 of first memory cells 175, . . . , 176, 179 to represent not only the data item (e.g., 161 or 163) but also the first mode.

For example, the first mode in which the first memory cells 175, . . . , 176, 179 are programmed can be indicated via the last bit stored in the memory cells 176 and 179, as illustrated in FIGS. 9 and 10.

For example, the threshold voltages of the predetermined number 165 of first memory cells 175, . . . , 176, 179 are programmed into a plurality of voltage regions (e.g., 221, 223, and possibly region 229). Preferably, the first mode is identifiable based on whether threshold voltages of one or more predetermined memory cells (e.g., 179) in the first memory cells 175, . . . , 176, and 179 are in a lowest voltage region 221 among the plurality of voltage regions (e.g., 221, 223, and possibly region 229). For example, in each of the plurality of modes (e.g., 172, 174), the controller 131 is configured to program a subset of the first memory cells 175, . . . 176, and 179 to have threshold voltages in the lowest voltage region 221, where the subset is selected for writing/programming according to bit values in the data item (e.g., 161 or 163) to be programmed. During reading, in each of the plurality of modes, the subset is identifiable via applying a read voltage, common to the plurality of modes (e.g., 172, 174), to the first memory cells 175, . . . 176, and 179. For example, the read voltage can be configured between the lower voltage region 221 and the middle voltage region 229.

Alternatively, the memory cell 179 is programmed in a predefined mode to store the indicator of the programming mode 191 of the remaining memory cells 175 to 176 in the memory cell set 171. The predefined mode of the memory cell 179 can be different from the programming mode 191 of the remaining memory cells 175 to 176. Preferably, reading the memory cell 179 in the predefined mode is performed in parallel with a first stage of reading the remaining memory cells 175 to 176 to reduce or eliminate the performance impact of the determination of the programming mode 191.

The memory cell set 171 programmed in different modes (e.g., 172, 174) can have different statistics of memory cells that have threshold voltages in the lower voltage region 221. The different statistics can be used to identify the programming mode 191 of the memory cell set 171, without storing the programming mode 191 using one or more bits of the encoded data item (e.g., 161 or 163).

For example, the encoding of bit values to be programmed into the memory cell set 171 in mode 172 can be configured to have a first percentage (e.g., 50%) of the memory cells 175, . . . , 176, and 179 to have threshold voltages in the lower voltage region 221. In contrast, the encoding of bit values to be programmed into the memory cell set 171 in mode 174 can be configured to have a second percentage (e.g., 35%) of the memory cells 175, . . . , 176, and 179 to have threshold voltages in the lower voltage region 221. Thus, the percentage of memory cells detected to be in the lower voltage region 221 can be used to infer the programming mode 191 of the memory cell set 171.

For example, the controller 131 of the memory device 130 can be configured to count the memory cells that are determined to be conductive under a read voltage (e.g., between the lower voltage region 221 and the middle voltage region 229) and thus have threshold voltages in the lower voltage region 221. Based on the count, the controller 131 can determine the memory cell set 171 is programmed in the mode 172 if the count is close to 50% of the memory cell set 171, or in the mode 174 if the count is close to 35% of the memory cell set 171.

For example, a threshold for the count of memory cells programmed in the lower voltage region can be used to identify the programming mode 191 of the memory cell set 171. After the read voltage (e.g., between the lower voltage region 221 and the middle voltage region 229) is applied to the memory cell set 171, the controller 131 can compare with the threshold the count of memory cells that become conductive under the read voltage. If more than the threshold of memory cells become conductive, the memory cell set 171 is programmed in one mode (e.g., 172); otherwise, the memory cell set 171 is programmed in another mode (e.g., 174).

Optionally, the controller 131 can cause the voltage drivers (e.g., bitline driver 147 and wordline driver 145) in the memory device 130 to gradually increase the voltage applied across each memory cell in the memory cell set 171. When the percentage of memory cells becoming conductive approaches the first percentage (e.g. 50%), the programming mode 191 of the memory cell set 171 can be identified as the mode 172 of storing one bit per memory cell; and when the percentage of memory cells becoming conductive approaches the second percentage (e.g. 35%), the programming mode 191 of the memory cell set 171 can be identified as the mode 174 of storing three bits per two memory cells.

Optionally, the memory cell set 171 can use one or more memory cells (e.g., 176, 179) to store or indicate an expected count of memory cells that have threshold voltages programmed in the lower voltage region 221. Preferably, the indicator of the expected count can be read/determined when the applied read voltage is above the lower threshold voltage region 221. In some embodiments, the memory cells (e.g., 176, 179) used to store the expected count, or its indicator are programmed using a predetermined mode (e.g., one bit per cell) so that the memory cells can be read just in time to determine whether the applied read voltage is sufficient to identify the memory cells having threshold voltages programmed to the lower voltage region 221.

Figure 13:
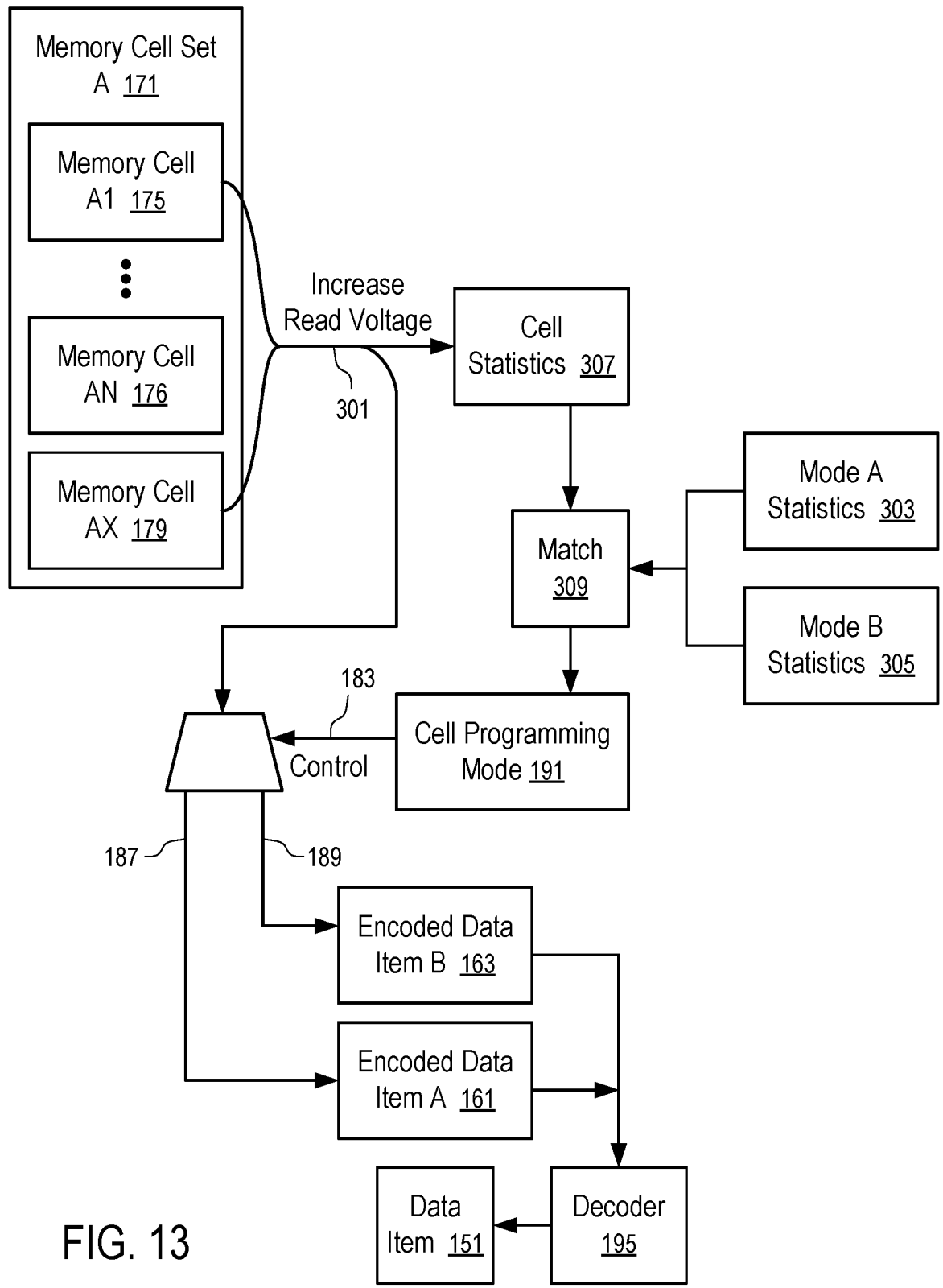
FIG. 13 illustrates a technique to determine a programming mode of a memory cell set based on the statistics of results from an initial stage of reading the memory cell set according to one embodiment.

FIG. 13 illustrates a technique to determine a programming mode of a memory cell set based on the statistics of results from an initial stage of reading the memory cell set according to one embodiment. For example, the technique of FIG. 13 can be used to read a memory cell set 171 or 173 in FIG. 4.

In FIG. 13, the controller 131 of a memory device 130 having the memory cell set 171 uses voltage drivers (e.g., bitline drivers 137 and wordline drivers 135) to increase 301 the magnitude of the read voltage applied across each of the memory cells 175, . . . , 176 and 179 in the memory cell set 171.

When the read voltage is increased to a level that is suitable to detect all of the memory cells in the memory cell set 171 have threshold voltages in the lower voltage region 221, the controller 131 can determine the cell statistics 307 of such memory cells (e.g., a count of such memory cells having threshold voltages lower than the applied read voltage, or a percentage of such memory cells in the memory cell set 171).

The cell statistics 307 is compared to the known statistics 303 and 305 pre-associated with different programming modes 172 and 174. A match 309 of the cell statistics 307 with one of the known statistics 303 and 305 identifies the cell programming mode 191 of the memory cell set 171 as the corresponding mode 172 or 174 associated with the matching statistics 303 or 305.

The identification of the cells in the lower voltage region 221 is the common operation to be performed to read the memory cell set 171 in different modes 172 and 174. Since the result of the common operation determines the programming mode 191 of the memory cell set 171, the subsequent read operations 187 and 189 of different modes 172 and 174 can be selectively performed under the control 183 of the programming mode 191.

For example, to determine values stored in the memory cell set 171 programmed in the mode 172 of storing one bit per memory cell, it is not necessary to further increase the applied read voltage. The bit values stored in the memory cells that are non-conductive under the applied read voltage are determined in the read operations 187 to be equal to the value 227 pre-associated with higher voltage region 223. The bit values stored in the memory cells 175, . . . , 176, and 179 provide the encoded data item 161.

However, if the programming mode 191 is the mode 174 of storing three bits per two memory cells, the controller 131 can further use the voltage drivers (e.g., bitline drivers 137 and wordline drivers 135) to further increase, in the read operations 189, the magnitude of the read voltage to a level that is suitable to detect all of the memory cells in the memory cell set 171 have threshold voltages in the lower voltage region 221 and in the middle voltage region 229. Since the memory cells having threshold voltages in the lower voltage region 221 have been previously identified, the additional memory cells become conductive after the further increase can be identified as memory cells having threshold voltages in the middle voltage region 229; and the remaining non-conductive memory cells have threshold voltages in the upper voltage region 223. Thus, the encoded data item 163 can be determined from the mapping between bit values and voltage regions illustrated in FIG. 8.

In some embodiments of memory cells 175, . . . , 176, and 179 that are configured as self-selecting memory cells having selector/memory devices, the memory cells 175, . . . , 176 and 179 can also be read in an opposite polarity. Memory cells programmed in the high voltage region 223 has low threshold voltages in the opposite polarity. In the read operations 189, the controller 131 can use the voltage drivers (e.g., bitline drivers 137 and wordline drivers 135) to apply a read voltage in the opposite polarity to detect or identify the memory cells having threshold voltages in the high voltage region 223. The remaining memory cells that are not in the high voltage region 223 and not in the low voltage region 221 have threshold voltages in the middle voltage region 229.

FIG. 14 illustrates a technique of incrementally increasing a voltage applied to a memory cell set to generate statistics usable in determination of a programming mode of the memory cell set according to one embodiment. For example, the technique of FIG. 14 can be used in FIG. 13 to match cell statistics 307 and known statistics 303 and 305 of programming modes 172 and 174.

In FIG. 14, the threshold voltage of the memory cells 175, . . . , 176 and 179 in a memory cell set 171 can be programmed into regions 221 and 223 in mode 172, or programmed into regions 221, 229, and 223 in mode 174.

The distribution 222 identifies the probability levels 321, 323 and 325 of a memory cell having its threshold voltage programmed at voltages V1, V2, and V3.

Since there is a high probability level 321 for the threshold voltage of a memory cell 101 being programmed near voltage V1, the percentage and count of memory cells that become conductive increase more rapidly when the read voltage is increased near voltage V1 than increased near other voltages (e.g., V2) having lower probability levels (e.g., 323).

Thus, after the read voltage increases from V1 through V2 to V3, the change in percentage/count of memory cells slows down to a stable level.

For example, when the read voltage increases from V1 through V2 to V3, the percentage of memory cells, detected to be conductive in mode 172, slows down its changes from percentage 331 to 333 and reaches a target (e.g., percentage 335). Similarly, when the read voltage increases from V1 through V2 to V3, the percentage of conductive memory cells programmed in mode 174 slows down its changes from percentage 332 to 334 and reaches a target (e.g., percentage 336). Thus, based on the different characteristics of the percentage of conductive memory cells in the memory cell set 171 during the increase from V1 to V3, the programming mode 191 of the memory cell set 171 can be determined.

Similarly, when the read voltage increases from V1 through V2 to V3, the count of conductive memory cells programmed in mode 172 slows down its changes from count 341 to 343 and reaches a target (e.g., count 345). When the read voltage increases from V1 through V2 to V3, the percentage of conductive memory cells programmed in mode 174 slows down its changes from count 342 to 344 and reaches a different target (e.g., count 346). The different characteristics/levels in the count of conductive memory cells as the read voltage increase from V1 to V3 can be used to determine the programming mode 191 of the memory cell set 171.

FIG. 14 illustrates an example where the mode 172 and mode 174 have the same voltage region 221 and probability distribution 222 for threshold voltages programmed into the lower voltage region 221. In general, it is not necessary to program the threshold voltage into the lower voltage region in the same way for the mode 172 and mode 174. For example, the lower voltage regions for the mode 172 and mode 174 can overlap partially; and the probability distribution in the overlapping region may not be identical to each other for the mode 172 and mode 174. When the mode 172 and mode 174 have different trends in cell count or percentage as the magnitude of the test voltage increases (e.g., from V1 to V3), the controller 131 can be configured to use the differences to identify the programming mode 191.

Figure 15:
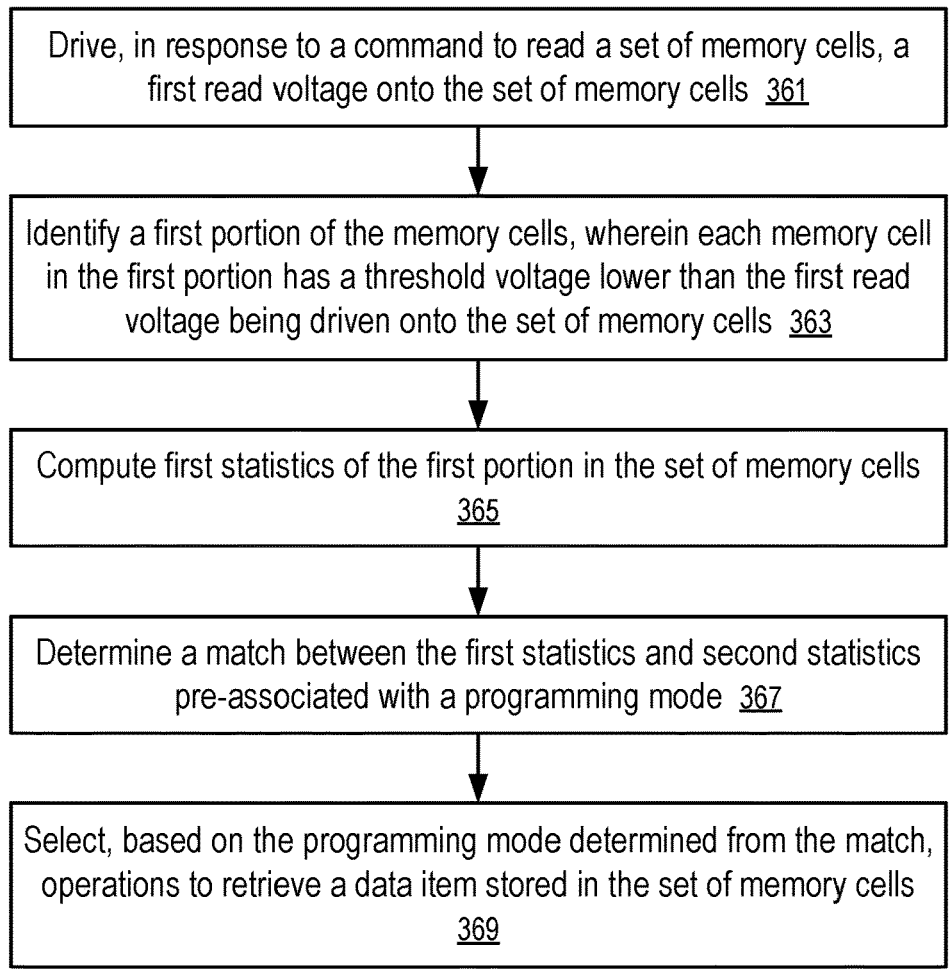
FIG. 15 shows a method to identify the programming mode of a set of memory cells based on memory cell statistics according to one embodiment.

FIG. 15 shows a method to identify the programming mode of a set of memory cells based on memory cell statistics according to one embodiment. For example, the method of FIG. 15 can be implemented in a computing system 100 of FIG. 1 and/or a memory device 130 of FIG. 2 with the techniques of FIGS. 7-14.

At block 361, a controller 131 uses voltage drivers to drive, in response to a command to read a set 171 of memory cells 175, ..., 176 and 179, a first read voltage onto the set of memory cells.

For example, the memory cells 175, ..., 176 and 179 can be applied the read voltage in parallel to test which of the memory cells 175, ..., 176 and 179 has a threshold voltage below the applied read voltage.

At block 363, the controller 131 identifies a first portion of the memory cells 175, ..., 175 and 179 such that each memory cell in the first portion has a threshold voltage lower than the first read voltage being driven onto the set of memory cells.

At block 365, the controller 131 computes first statistics of the first portion in the set of memory cells, such a count of memory cells in the first portion, or a ratio between memory cells in the first portion and the entire set 171 of memory cells 175, ..., 176 and 179.

At block 367, the controller 131 determines a match between the first statistics and second statistics pre-associated with a programming mode 191.

For example, the controller 131 uses voltage drivers to increase a magnitude of a read voltage driven onto the set of memory cells in increments to reach the first read voltage. For example, the magnitude of the read voltage can be driven to V1, and then to V2, and then V3. The first statistics can include a change of a size of the first portion as a function of the increments, as illustrated in FIG. 14. The memory cells programmed in different modes have different trend, trajectory, and/or targets for the first statistics, as the magnitude increases. Alternatively, the controller 131 can be configured to apply V3 directly and determine whether the count or percentage of memory cells having threshold voltages below V3 matches with the corresponding count or percentage of the mode 172 or mode 174.

For example, the first statistics can be computed to identify a ratio of memory cell population between the first portion and the set of memory cells, or a count of memory cells in the first portion (since the cell population of the memory cell set 171 does not change).

Preferably, an identification of the first portion is used in reading the set memory cell programmed in the first mode and in reading the set of memory cell programmed in the second mode. Thus, the operation of determining the first portion can be the common operation for the first mode and the second mode; and the delay caused by the identification of the programming mode 191 is reduced or eliminated.

At block 369, the controller 131 selects, based on the programming mode 191 determined from the match, operations to retrieve a data item stored in the set of memory cells.

For example, the programming mode 191 can be selected, based on the match 309, from a first mode 172 and a second mode 174 that store more bits per memory cell than the first mode.

For example, the first mode 172 programs each memory cell (e.g., 176 or 179) to store one bit of data via configuring its threshold voltages in one of two voltage regions. In contrast, the second mode 174 programs two memory cells (e.g., 176 and 179) to store three bit of data via configuring the threshold voltage of each memory cell in one of three voltage regions.

In one example, in response to the programming mode 191 being the second mode 174, the operations selected in block 369 to be performed include: driving a second read voltage, higher than the first read voltage onto the set 171 of memory cells; identifying such a second portion of the memory cell that each memory cell in the second portion has a threshold voltage lower than the second read voltage but higher than the first read voltage; and determining the data item based on identification of the first portion and identification of the second portion.

In another example, the first read voltage is driven onto the set of memory cells in a first polarity; and in response to the programming mode being the second mode 174, the operations selected in block 369 include: driving a second read voltage in a second polarity, opposite to the first polarity, onto the set of memory cells; identifying such a second portion of the memory cells that each memory cell in the second portion has a threshold voltage lower than the second read voltage in the second polarity but higher than the first read voltage in the first polarity; and determining the data item based on identification of the first portion and identification of the second portion.

Figure 16:
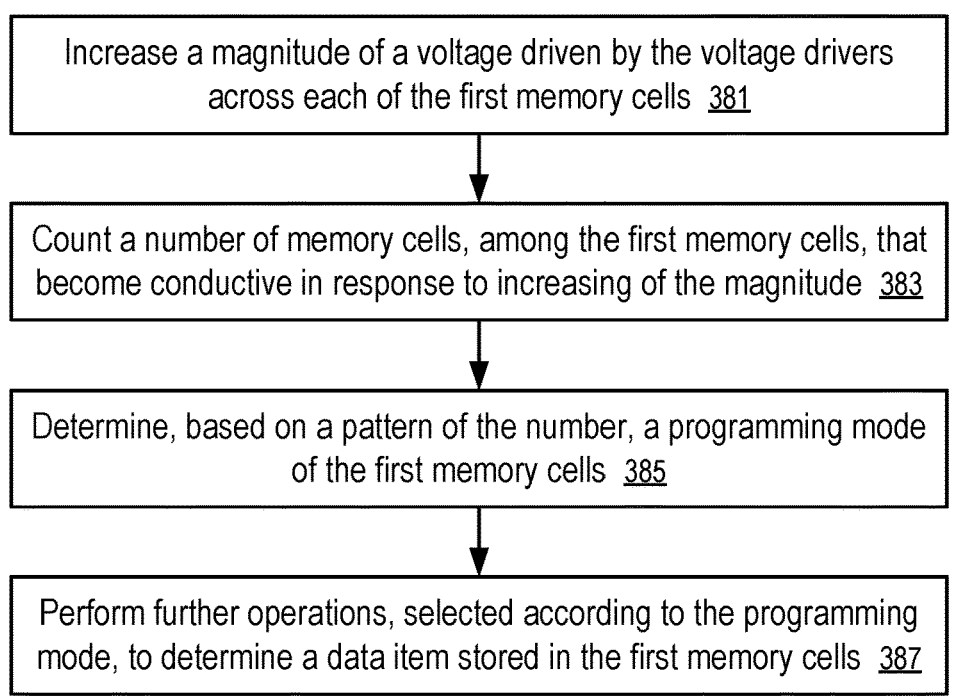
FIG. 16 shows another method to identify the programming mode of a set of memory cells based on memory cell statistics according to one embodiment.

FIG. 16 shows another method to identify the programming mode of a set of memory cells based on memory cell statistics according to one embodiment. For example, the method of FIG. 16 can be implemented in a computing system 100 of FIG. 1 and/or a memory device 130 of FIG. 2 with the techniques of FIGS. 7-14.

At block 381, in response to a command to read a set 171 of first memory cells (e.g., 175, ..., 176, 179) in a memory device 130, voltage drivers (e.g., bitline drivers 137 and wordline drivers 135) in the memory device 130, controlled by a controller 131 of the memory device 130, increase a magnitude of a voltage driven by the voltage drivers across each of the first memory cells (e.g., 175, ..., 176, 179).

In general, different memory cells in the memory cell set 171 can have different responses to the increasing magnitude of the voltage, due to the probability distribution of their threshold voltage being programmed to a particular region (e.g., 221) and the different voltage regions in which their threshold voltages are programmed to.

At block 383, the controller 131 counts a number of memory cells, among the first memory cells (e.g., 175, ..., 176, 179), where the counted memory cells become conductive in response to increasing of the magnitude.

At block 385, the controller 131 determines, based on a pattern of the number, a programming mode 191 of the first memory cells (e.g., 175, ..., 176, 179).

For example, the pattern can include the number approaching a target pre-associated with the programming mode 191 as the magnitude increases.

As illustrated in FIG. 14, the number can include the percentage of the counter memory cells in the memory cell set 171, or a count of the memory cells being counted; and the same memory cell set 171 programmed in different modes can have the number approaching different targets (e.g., percentages 335 or 336; counts 345 or 346) as the voltage increases from V1 through V2 to V3. Based on the way the number approaching a target, one of a plurality of predefined modes (e.g., 172, 174) that has the matching way to approaching a corresponding target can be identified as the programming mode 191 of the memory cell set 171.

At block 387, the controller 131 performs further operations, selected according to the programming mode 191, to determine a data item stored in the first memory cells.

For example, in response to a determination that the programming mode 191 is a first mode 172 of storing one bit per memory cell, the controller 131 can use the voltage drivers to increase the magnitude to such a level that the number is equal to the target pre-associated with the first mode 172. When the magnitude is increased to the level, the controller 131 can identify such a first subset of the first memory cells 175, . . . , 176 and 179 that each memory cell in the first subset is conduction at the applied level of read voltage and thus has threshold voltage below the applied level of read voltage. The first subset has threshold voltages programmed to the lower voltage region 221 and thus has stored therein a bit value 225 pre-associated with the lower voltage region 221. A second subset in the first memory cells 175, . . . , 176 and 179 can be identified to include each memory cell being non-conductive when the magnitude is increased to the applied level of read voltage. The second subset has threshold voltages higher than the voltage region 221 and thus can be inferred to have threshold voltages in the higher voltage region 223 without further testing. The second subset stores a bit value 227 pre-associated with the lower voltage region 221. Thus, the controller 131 can determine the data item 161 based on the identification of the first subset and the second subset.

Optionally, the data item 161 can include a set of bits configured to indicate or identify the target and/or the programming mode 191. The controller 131 can confirm that the inferences made in the obtaining the data item 161 by comparing the programming mode 191 inferred from the pattern matching and the indicator retrieved from the data item 161, and/or comparing the inferred target with the target retrieved from the data item 161.

As an example, in response to a determination that the programming mode 191 is a second mode 174 of storing three bits per two memory cells, the controller 131 can use the voltage drivers to increase the magnitude to such a first level that the number is equal to the target pre-associated with the second mode 174. A first subset is identified to have threshold voltages in the lower voltage region 221. Then, the controller 131 can use the voltage drivers to increase the magnitude to such a second level that the number is equal to a further target pre-associated with the second mode 174. A second subset is identified to have threshold voltages in the middle voltage region 229, for being non-conductive at the first level but conductive at the second level. A third subset is identified to have threshold voltages in the upper voltage region 223, for being non-conductive at the second level. Based on combinations of the voltage regions of threshold voltages of each pair of memory cells, the controller can determine the three-bit values stored in each pair of memory cells, as illustrated in FIG. 8 and thus the data item 163 stored in the memory cell set 171.

Optionally, instead of further increasing the magnitude to such a second level discussed in the above example, the controller 131 uses the voltage drivers to reverse polarity of the voltage applied on each of the memory cells 175, . . . 176 and 179. The controller 131 increases the magnitude of the voltage applied in reverse polarity to such a third level that the number is equal to a further target pre-associated with the second mode 174. The third subset can be identified to be conductive when the magnitude is increased to the third level in reverse polarity. The second subset can be identified for being absent from the first subset and the third subset.

Thus, the data item 163 can be determined based on the identification of the first subset, the second subset, and the third subset.

Figure 17:
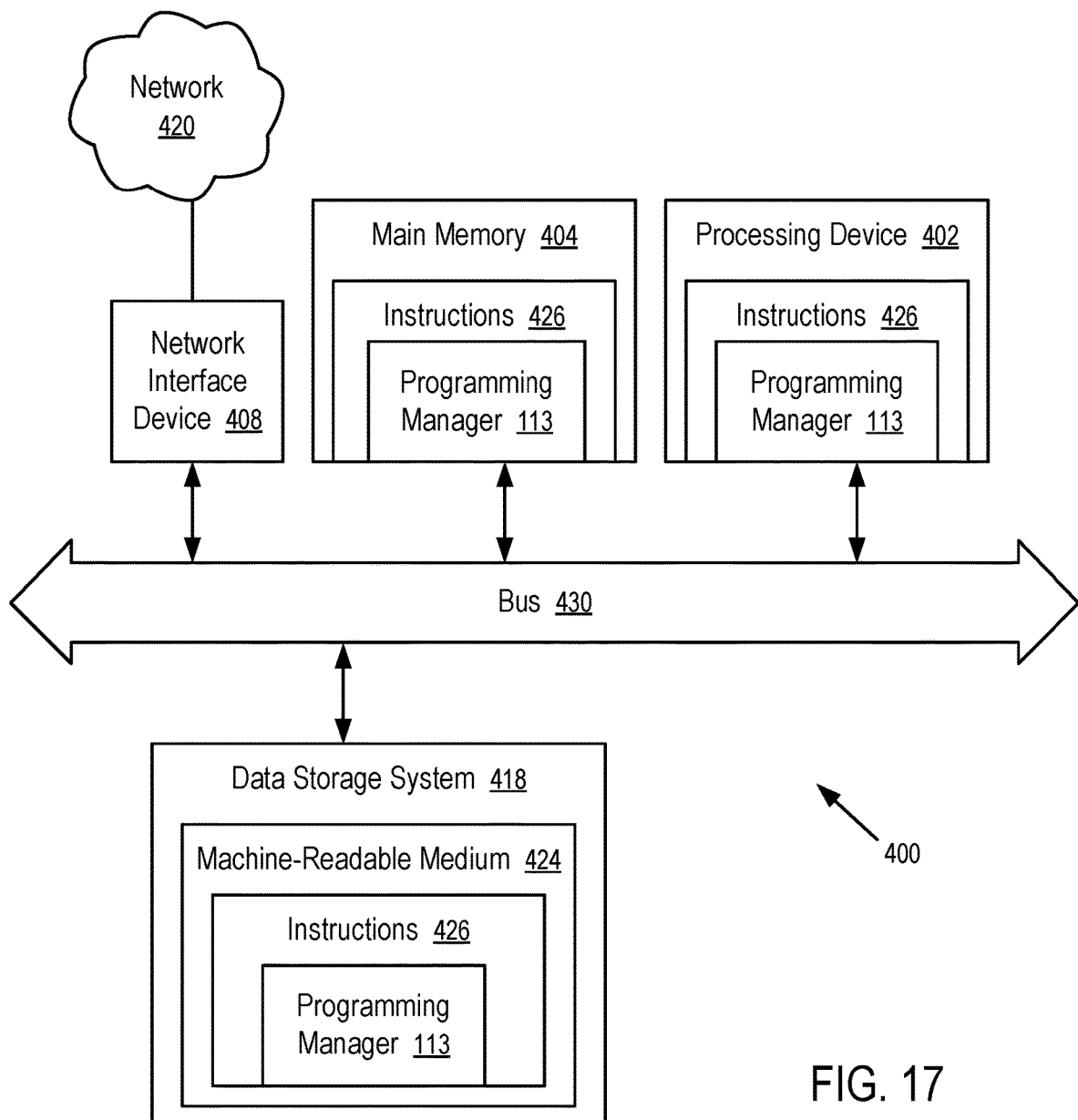
FIG. 17 is a block diagram of an example computer system in which embodiments of the present disclosure can operate.

FIG. 17 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a programming manager 113 (e.g., to execute instructions to perform operations corresponding to the programming manager 113 described with reference to FIGS. 1-16). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a programming manager 113 (e.g., the programming manager 113 described with reference to FIGS. 1-16). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    receiving a command to read a set of memory cells;
    applying, in response to the command, a first read voltage to the memory cells to identify a first subset of the memory cells;
    determining a programming mode of the set of memory cells; and
    continuing execution of the command to determine a first data item stored, via the programming mode.

2. The method of claim 1, wherein the programming mode is selected from a first mode and a second mode that store more bits per memory cell than the first mode.

3. The method of claim 2, wherein the first mode programs the set of memory cells to store one bit per memory cell; and the second mode programs the set of memory cells to store three bits per two memory cells.

4. The method of claim 2, wherein both the first mode and the second mode program threshold voltages of portions of the memory cells to a voltage region lower than the first read voltage.

5. The method of claim 2, wherein the first mode programs the memory cells to have threshold voltages within a first number of voltage regions to represent values stored in the memory cells; the second mode programs the memory cells to threshold voltages within a second number of voltage regions, more than the first number, to represent values stored in the memory cells; the first number of voltage regions include one voltage region and no more than one voltage region that is lower than the first read voltage; and the second number of voltage regions include one voltage region and no more than one voltage region lower than the first read voltage.

6. The method of claim 2, wherein in response to the programming mode is the second mode, the continuing execution of the command comprises:
applying a second read voltage, higher than the first read voltage to the memory cells to identify a second subset of the memory cells, wherein memory cells in the second subset are conductive under the second read voltage;
determining the first data item based on identification of the first subset and the second subset.

7. The method of claim 2, wherein the first read voltage is applied to the memory cells in a first polarity; and in response to the programming mode is the second mode, the continuing execution of the command comprises:
applying a second read voltage in a second polarity, opposite to the first polarity, to the memory cells to identify a second subset of the memory cells, wherein memory cells in the second subset are conductive under the second read voltage;
determining the first data item based on identification of the first subset and the second subset.

8. A computing device, comprising:
a memory device having a controller and a plurality of memory cells; and
at least one processor coupled to the memory device and configured to transmit, to the memory device, a command configured to instruct the memory device to store a data item into a predetermined number of first memory cells among the plurality of memory cells;
wherein in response to the command, the controller of the memory device is configured to:
program, according to a first mode selected from a plurality of predefined modes, threshold voltages of the predetermined number of first memory cells to represent the data item and the first mode.

9. The computing device of claim 8, wherein the threshold voltages of the predetermined number of first memory cells are programmed into a plurality of voltage regions; and the first mode is identifiable based on whether threshold voltages of one or more predetermined memory cells in the first memory cells are in a lowest voltage region among the plurality of voltage regions.

10. The computing device of claim 8, wherein the plurality of predefined modes includes:
a mode of storing one bit per memory cell; and
a mode of storing more than one bit per memory cell.

11. The computing device of claim 10, wherein the plurality of predefined modes includes a mode of storing three bits per two memory cells.

12. The computing device of claim 11, wherein in each of the plurality of modes, the controller is configured to program a subset of the first memory cells to have threshold voltages in the lowest voltage region.

13. The computing device of claim 12, wherein in each of the plurality of modes, the subset of the first memory cells is identifiable via applying a read voltage, common to the plurality of modes, to the first memory cells.

14. A memory device, comprising:
a plurality of memory cells;
a plurality of voltage drivers connected to memory cells; and
a controller coupled to the voltage drivers configured to:
read first memory cells among the plurality of memory cells,
increase voltages driven by the voltage drivers across the first memory cells respectively up to a first read voltage; and
determine a programming mode of the first memory cells and
identify further operations based on the programming mode.

15. The memory device of claim 14, wherein when a memory cell is in the conductive state, the memory cell allows larger than a predetermined threshold current to go through the memory cell; and when the memory cell is in the non-conductive state, the memory cell allows smaller than the predetermined threshold current to go through the memory cell.

16. The memory device of claim 15, wherein when the programming mode stores more than one bit per memory cell, the further operations are configured at least to further increase the voltages to a second read voltage, higher than the first read voltage, and identify a second subset of the memory cells that change from the non-conductive state to the conductive state when the voltages are driven up to the second read voltage.

17. The memory device of claim 15, wherein the first read voltage is applied in a first polarity across the first memory cells; and when the programming mode stores more than one bit per memory cell, the further operations are configured at least to reduce the voltages to zero and increase magnitudes of the voltages driven by the voltage drivers cross the first memory cells respectively up to a second read voltage in a second polarity opposite to the first polarity.

18. The memory device of claim 15, wherein the programming mode is selected from a plurality of predefined modes, including:
a mode of storing one bit per memory cell; and
a mode of storing more than one bit per memory cell.

19. The memory device of claim 18, wherein the plurality of predefined modes includes a mode of storing three bits per two memory cells.

* * * * *